United States Patent [19]
Sasaya et al.

[11] Patent Number: 5,831,776
[45] Date of Patent: Nov. 3, 1998

[54] PROJECTION OPTICAL SYSTEM AND PROJECTION EXPOSURE APPARATUS

[75] Inventors: Toshihiro Sasaya, Yokohama; Kazuo Ushida, Tokyo; Yutaka Suenaga, Yokohama, all of Japan; Romeo I. Mercado, Fremont, Calif.

[73] Assignee: Nikon Corporation, Tokyo, Japan

[21] Appl. No.: 944,590

[22] Filed: Oct. 6, 1997

Related U.S. Application Data

[63] Continuation of Ser. No. 777,862, Dec. 31, 1996, abandoned, which is a continuation of Ser. No. 642,221, Apr. 30, 1996, abandoned, which is a continuation of Ser. No. 152,164, Nov. 15, 1993, abandoned.

[51] Int. Cl.$^6$ .............................. G02B 9/64; G02B 13/22
[52] U.S. Cl. ............................. 359/754; 359/663
[58] Field of Search ..................... 359/663, 754

[56] References Cited

U.S. PATENT DOCUMENTS

| | | | |
|---|---|---|---|
| 3,504,961 | 4/1970 | Hoogland et al. | 350/214 |
| 3,897,138 | 7/1975 | Kano | 350/183 |
| 4,386,828 | 6/1983 | Hirose | 350/427 |
| 4,592,625 | 6/1986 | Uehara et al. | 350/415 |
| 4,666,273 | 5/1987 | Shimizu et al. | 353/101 |
| 4,770,477 | 9/1988 | Shafer | 350/1.2 |
| 4,772,107 | 9/1988 | Friedman | 350/463 |
| 4,811,055 | 3/1989 | Hirose | 355/53 |
| 4,891,663 | 1/1990 | Hirose | 355/53 |
| 4,948,238 | 8/1990 | Araki et al. | 350/469 |
| 4,977,426 | 12/1990 | Hirose | 355/53 |
| 5,105,075 | 4/1992 | Ohta et al. | 250/201.2 |
| 5,170,207 | 12/1992 | Tezuka et al. | 355/53 |
| 5,260,832 | 11/1993 | Togino et al. | 359/679 |
| 5,448,408 | 9/1995 | Togino et al. | 359/651 |

FOREIGN PATENT DOCUMENTS

| | | |
|---|---|---|
| 47-35017 | 9/1972 | Japan . |
| 55-12902 | 1/1980 | Japan . |
| 58-78115A | 5/1983 | Japan . |
| 63-118115 | 5/1988 | Japan . |
| 63-121810 | 5/1988 | Japan . |
| 1-19317A | 1/1989 | Japan . |
| 4-42208A | 2/1992 | Japan . |
| 4-157412 | 5/1992 | Japan . |
| 5-173065 | 7/1993 | Japan . |

OTHER PUBLICATIONS

Braat, Joseph "Optical microlithographic technology for integrated circuit fabrication and inspection," SPIE, pp. 22–30 (SPIE, vol. 811, 2–3 Apr. 1987, The Hague, Netherlands).

*Primary Examiner*—Scott J. Sugarman
*Attorney, Agent, or Firm*—Townsend and Townsend and Crew LLP

[57] ABSTRACT

A projection optical system that projects an image of an object in an object surface onto an image surface with a fixed reduction magnification comprises, in light path order from the object surface: a first group of lenses with positive refractive power; a second group of lenses forming an approximately afocal system; and a third group of lenses with positive refractive power. The projection optical system has a focal length F, the projection optical system has a projection magnification B, the object surface and the image surface are separated by a distance L, and a lens surface in the first group of lenses that is closest to the object surface is separated from the object surface by a distance $d_0$. A paraxial marginal ray from an axial object point on the object surface enters the second group of lenses $G_2$ at an entrance height $h_1$ from an optical axis, and the paraxial marginal ray from the axial object point on the object surface emerges from the second group of lenses $G_2$ at an emergence height $h_2$ from the optical axis. The optical system is characterized by the following:

$$1.8 \leq |F/(B \cdot L)| \leq 6,$$

$$d_0/L \leq 0.2,$$

and $$4 \leq |h_2/h_1| \leq 10.$$

55 Claims, 10 Drawing Sheets

PROJECTION OPTICAL SYSTEM AND PROJECTION EXPOSURE APPARATUS

This is a continuation of Ser. No. 08/777,862, filed Dec. 31, 1996, which is a continuation of Ser. No. 08/642,221, filed Apr. 30, 1996, which is a continuation of Ser. No. 08/152,164, filed Nov. 15, 1993, all now abandoned.

BACKGROUND OF THE INVENTION

1. Field of the Invention

The present invention generally relates to projection optical systems as well as projection exposure apparatus for the purpose of reduction projection of patterns on the first object onto the second object such as a substrate, and particularly relates to projection optical systems as well as projection exposure apparatus which are ideal for projection alignment of integrated circuit patterns formed on a reticle (mask) as the first object onto a substrate (wafer) as the second object.

2. Related Background Art

As integrated circuit patterns become more refined, the performance required for projection optical systems used for wafer printing has become more rigorous. Under such a circumstance, in order to improve resolution of projection optical systems, it can be considered either to further shorten an exposure wavelength λ or to increase a numerical aperture NA of projection optical systems.

In recent years, in order to accommodate further refinement of print patterns, a light source to be used for exposure has become substituted from the one that emits g line (436 nm) exposure wavelength to mainly the one that emits i line (365 nm) exposure wavelength. Furthermore, a light source that emits light with shorter wavelength, such as excimer laser (248 nm, 193 nm), is about to be used.

And a projection optical system which performs projection alignment of a pattern on a reticle onto a wafer by use of each of the aforementioned exposure wavelengths is being proposed.

What is required for a projection optical system along with improving resolution is reduction of image distortion. What is termed as "image distortion" herein are, besides the distortion due to a projection optical system (distortion aberration), the one due to curvature of a wafer to be imaged thereon on the image side of a projection optical system and the one due to curvature of a reticle on the object side of the projection optical system on which IC patterns and such are described.

Therefore, in order to lessen an influence due to wafer curvature upon image distortion, so-called an image side telecentric optical system, which places an exit pupil on the image side of the projection optical system farther, has been used.

Meanwhile, with regard to reduction of image distortion due to reticle curvature, it has been considered to make the object side of the projection optical system a telecentric optical system, and thus it has been proposed to place an entrance pupil position of the projection optical system comparatively farther from the object plane. Some of such examples are Patent Disclosure Showa #63-118115, Patent Disclosure Heisei #4-157412, and Patent Disclosure Heisei #5-173065.

The projection optical systems proposed in each of the above mentioned Patent public information, however, have small numerical apertures NA and do not have high resolution, or have narrow exposure areas. Also with regard to an entrance pupil position of the projection optical systems, it was simply placed comparatively farther from the object plane (reticle), and telecentricity on the object side (reticle side) and on the image side (wafer side) was not corrected adequately.

Also, although some of the projection optical systems proposed in the aforementioned Patent Information materialized telecentricity on the object side by increasing the distance from the object plane (reticle) to a first lens surface of the projection optical system, since the distance between the object and the image (the distance between the reticle and the wafer) has become extremely long compared to the exposure area, it has brought such a problem as growing of the size of the optical system per se.

The present invention was conducted in light of the above mentioned issues, and its objective is, while maintaining a comparatively large exposure area even in the case where the flatness of the first object (reticle) as well as the second object (wafer) is extremely bad, to offer a compact projection optical system which obtains substantially less image distortion and makes it possible to minimize not only an overall length of the lens system but also a diameter of the lenses to the utmost and has high-resolution and a large numerical aperture NA.

SUMMARY OF THE INVENTION

In order to attain the above mentioned objective, a projection optical system according to an aspect of the present invention which projects an image of a first object with a reduced magnification onto a second object comprises, viewed from said first object side, in order of succession, a first group of lenses with positive refractive power, a second group of lenses virtually constituted by afocal systems, and a third group of lenses with positive refractive power, and when a focal length of said projection optical system is represented by F, a projection magnification of said projection optical system is represented by B, a distance between said first object and said second object is represented by L, a distance from said first object to a lens surface closest to the first object in said first group of lenses is represented by $d_0$, a height of a paraxial marginal ray from an optical axis as he paraxial marginal ray from the axial object point on said first object enters into the second group of lenses $G_2$ is represented by $h_1$, a height of the paraxial marginal ray from the optical axis as the paraxial marginal ray from the axial object point on said first object emerges from the second group of lenses $G_2$ is represented by $h_2$, then it is constituted so as to satisfy the following conditions.

$$1.8 \leq |F/(B \cdot L)| \leq 6$$

$$d_0/L \leq 0.2$$

$$4 \leq |h_2/h_1| \leq 10$$

A projection exposure apparatus, according to an other aspect of the present invention, comprises an illumination means that illuminates the first object on which a fixed pattern is formed, a projection optical system which projects the image of said first object onto the second object, the first supporting means which supports said first object, the second supporting means which supports said second object, and said projection optical system thereof comprises, viewed from said first object side, in order of succession, the first group of lenses with positive refractive power, the second group of lenses virtually constituted by afocal systems, and the third group of lenses with positive refractive power, and when the focal length of said projection optical system is represented by F, the projection magnification of said projection optical system is represented by B, the distance from said first object to the lens surface closest to the first object in said first group of lenses is represented by $d_0$, the height of the paraxial marginal ray from the optical axis as the paraxial marginal ray enters the second group of lenses $G_2$ is represented by $h_1$, the height of the paraxial marginal ray from the optical axis as the paraxial marginal ray emerges from the second group of lenses $G_2$ is represented by $h_2$, then, it is constituted so as to satisfy the following conditions.

$$1.8 \leq |F/(B \cdot L)| \leq 6$$

$$d_0/L \leq 0.2$$

$$4 \leq |h_2/h_1| \leq 10$$

Thus, according to the present invention, the projection optical system which corrects various aberrations proportionately despite the fact that not only the lens diameter but also the overall length of the projection optical system are small, while maintaining a comparatively large exposure area and furthermore has a high numerical aperture NA and high resolution can be attained. This will enable to materialize a projection exposure apparatus of high performance.

Also, because so-called a both sides telecentric optical system, which places the entrance pupil position of the projection optical system farther than the object plane (reticle plane) and the exit pupil position farther away from the image plane (wafer plane) can be materialized, it will be made possible to solve the problems regarding image distortion due to curvature of the object plane and the image plane.

DESCRIPTION OF THE PREFERRED EMBODIMENT

First of all, before embodiments according to the present invention are described, a basic configuration as well as various favorable conditions thereof will be described.

Figure 1:
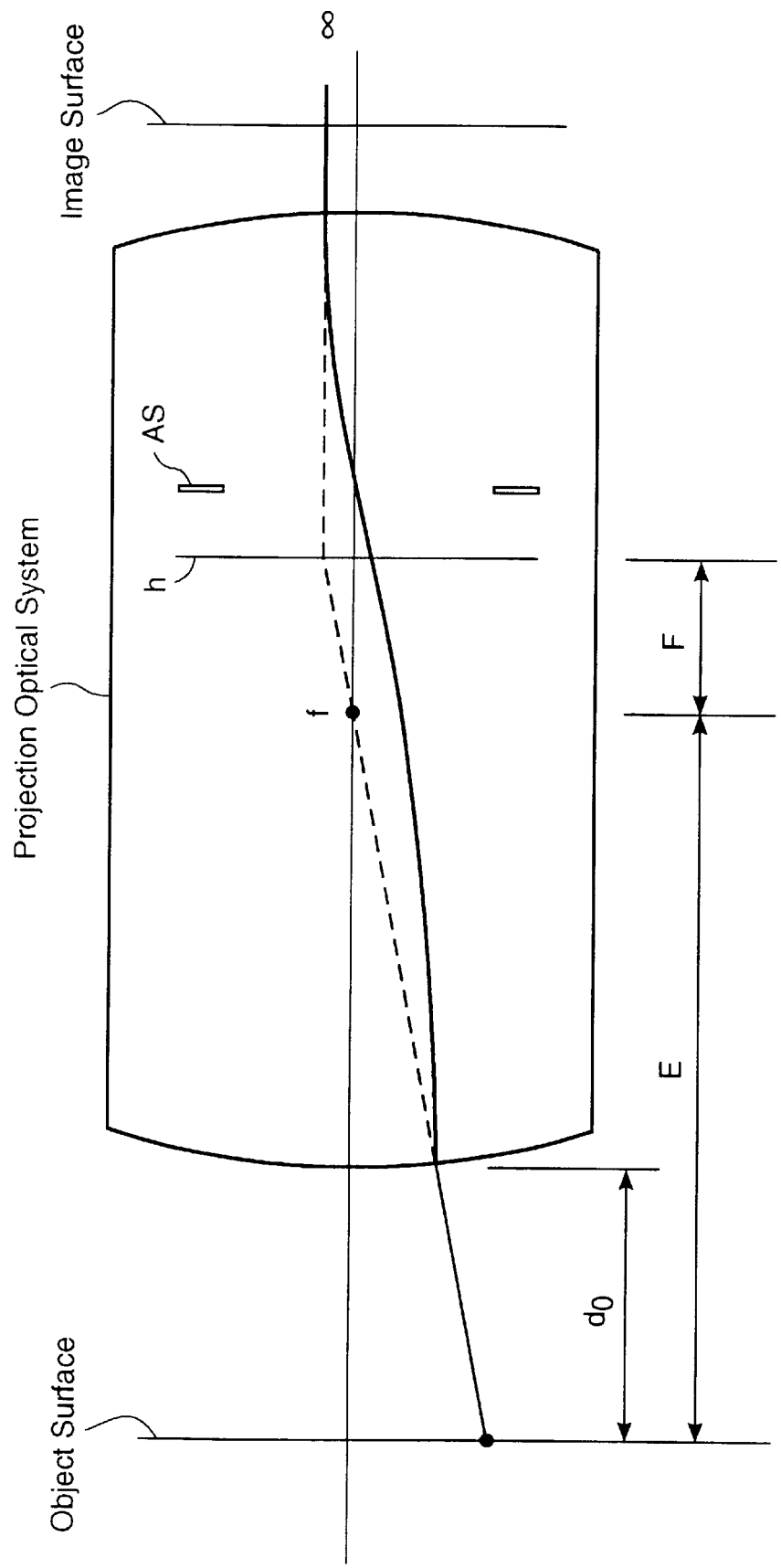
FIG. 1 is a conceptual drawing showing the projection optical system according to the present invention which is telecentric on both sides.

As appears from FIG. 1, normally, an aperture stop AS is installed at the pupil position of the projection optical system, and the entrance pupil position of the projection optical system can be found from a paraxial amount given by the paraxial ray as an image position by an optical system placed more on the object side (reticle side) than the aperture stop AS.

However, the entrance pupil position of the optical system generally varies according to a height of an object H (the height of the object from the optical axis). Therefore, the entrance pupil position of the projection optical system can be considered to be determined in accordance with an each of the height of the object H.

Meanwhile, the influence due to the curvature of the reticle on the object side of the projection optical system upon the image distortion is proportionate to telecentricity of incoming rays entering the projection optical system from the reticle T, i.e., a gradient of a chief ray of the incoming rays subtended by the optical axis of the projection optical system.

Here, if telecentricity of the incoming rays (chief ray) from the height H (the object height H) from the optical axis on the reticle is represented by T(H), a distance between the entrance pupil position of the projection optical system determined by the incoming rays (chief ray) from the height H from the optical axis on the reticle (designated hereinafter as the object height H) and the reticle is represented by E(H), then T(H) and E(H) are related by $$T(H)=H/E(H) \qquad (1).$$

Therefore, in order to obtain constantly uniform telecentricity for the purpose of making the influence upon the image distortion uniform independently of the object height H, it would be sufficient to change the entrance pupil position of the projection optical system so as to be proportionate to the object height H. In other words, by placing the entrance pupil position of the projection optical system at the time when the object height H is low closer to the object side (reticle side) than the entrance pupil position at the time when the object height H is high, it will become possible to make an influence upon the image distortion uniform.

Therefore, in the present invention, the fact that a degree of the influence upon the image distortion of the entrance pupil position of the optical system also varies depending on the height of the object is being paid attention to, although generally the entrance pupil position of the optical system varies depending on height of the object, and by balancing the entrance pupil positions according to the height of the object height H (the height from the optical axis on the reticle), it is made possible to make the influence upon the image distortion on the entire object plane (the entire lens plane) uniform.

Condition (I), as shown below, provides for an optimal ratio of the focal length of the projection optical system F and an imagery magnification of the projection optical system B multiplied by the distance between the object and the image L (the distance between the reticle and the wafer).

$$1.8 \leq |F/(B \cdot L)| \leq 6 \tag{I}$$

This condition (I) connotes that it will be equivalent as providing for the ratio of the distance from the object plane (reticle plane) to the paraxial entrance pupil of the projection optical system E and the distance between the object and the image L (the distance from the reticle to the wafer), supposing the paraxial exit pupil position of the projection optical system on the image side (wafer side) (the exit pupil position of the projection optical system determined by the paraxial ray) is at infinity.

To describe it concretely, as shown in FIG. 1, the primary focal point of the entire projection optical system f (a focal point on the reticle side) corresponds to the paraxial entrance pupil position supposing the paraxial exit pupil position of the projection optical system is at infinity, and if the focal length of the entire projection optical system is, when h represents a primary principal plane of the projection optical system, represented by F, the projection magnification of the projection optical system is represented by B, the distance from the object plane (reticle plane) to the primary focal point of the entire projection optical system f is represented by E, then according to a lateral magnification equation, the following relation should be established.

$$B = F/E \tag{2}$$

And transforming the above mentioned Eq. (2) yields $$E = F/B \tag{3}$$

and dividing the both sides of Eq. (3) by the distance between the object and the image L (the distance from the reticle to the wafer) and taking its absolute value finally derives Eq. (4) with regard to the above mentioned Condition (I).

$$|E/L| = |F/(B \cdot L)| \tag{4}$$

From the above, it can be understood that Condition (I) provides for the absolute value of the optimal ratio of the distance from the object plane (reticle plane) to the paraxial entrance pupil E and the distance between the object and the image L (the distance between the reticle and the wafer), supposing the paraxial exit pupil position of the projection optical system on the image side (wafer side) is at infinity.

When going below the lowest limit of Condition (I), the entrance pupil position of the projection optical system becomes too close compared to the distance between the object and the image L (the distance from the reticle to the wafer), and the telecentricity over the entire object plane (entire reticle plane) will aggravate, and thus balancing and correcting it will become difficult. When surpassing the Condition (I), a deviation of the entrance pupil position by the allowed entrance height (the object height H) becomes small, and a degree of freedom in terms of designing to balance the entrance pupil position of the projection optical system which is determined by the incoming rays from the object height H (the height H from the optical axis on the reticle) in order to maintain telecentricity on the entire object plane (entire reticle plane well becomes too small. Hence, it becomes necessary to keep the entrance pupil position of the projection optical system farther away over the entire object plane (the reticle plane) more than necessary, and as a result, it becomes inevitable to comprise the projection optical system with more number of lenses and accordingly to grow the size of the projection optical system and to complicate thereof.

Also, Condition (I) provides for the optimal paraxial entrance pupil position (the exist pupil position of the projection optical system determined by the paraxial ray) of the projection optical system, supposing the paraxial exit pupil position of the projection optical system on the image side (wafer side) is at infinity, but it also simultaneously takes the optimal exit pupil position of the projection optical system into consideration.

To describe it concretely, supposing the paraxial entrance pupil position of the projection optical system on the object side (reticle side) is at infinity, if the distance from the paraxial exit pupil position of this projection optical system to the image field (wafer plane) is represented by E', then according to a lateral magnification equation, the following equation will hold.

$$1/B = F/E' \tag{5}$$

And transforming the above Eq. (5) derives the following Eq. (6).

$$E = F \cdot B = (F/B) \cdot B^2 \tag{6}$$

Using the above mentioned Eq. (3), a further transformation of the above mentioned Eq. (6) derives the following Eq. (7).

$$E = E \cdot B^2 \tag{7}$$

This Eq. (7) is equivalent to Eq. (3) multiplied by the square of the projection magnification B ($B^2$) of the projection optical system, and dividing the both sides of the above mentioned Eq. (7) by the distance between the object and the image L (the distance from the reticle to the wafer) and taking its absolute value derive the following Eq. (8).

$$|F \cdot B/L| = |[F/(B \cdot L)]| \cdot B^2 \tag{8}$$

This Eq. (8) is equivalent to the above mentioned Eq. (4) with regard to Condition (I) multiplied by the square of the projection magnification of the projection optical system B($B^2$), and applying the above to the aforementioned Condition (I) yields the following Eq. (9).

$$1.8 \cdot B^2 \leq |F/(B \cdot L)| \cdot B^2 \leq 6 \cdot B^2 \tag{9}$$

Therefore, Condition (I) provides for the optimal paraxial entrance pupil position of the projection optical system, supposing the paraxial exit pupil position of the projection optical system is at infinity, and simultaneously, by considering the amount of the entire conditional equation multiplied by $B^2$, it can be understood that it also provides for the paraxial exit pupil position, supposing the paraxial entrance pupil position of the projection optical system is at infinity.

Therefore, the paraxial exit pupil position of the projection optical system on the image side (wafer side) as well as the paraxial entrance pupil position of the projection optical system on the object side (reticle side) do not necessarily have to be completely at infinity, and as long as it is within the range of Condition (I), it can be understood that it is possible to virtually well-proportionately maintain the telecentricity on both the image side (wafer side) and the object side (reticle side).

Condition (II) provides for, as shown below, an optimal distance $d_0$ from the object plane (reticle plane) to the lens surface closest to the object side in the first group of lenses of the projection optical system for the distance between the object and image L (the distance from the reticle to the wafer).

$$d_0/L \leq 0.2 \quad (II)$$

It is possible to place the entrance pupil position of the projection optical system farther and make the object plane (reticle plane) telecentric by leaving a long distance between the object plane (reticle plane) and the lens surface which is closest to the object side in the first group of lenses $d_0$. If the distance $d_0$ is increased beyond the upper limit of Condition (II), however, the ratio of the distance $d_0$ to the distance between the object and the image L (the distance from the reticle to the wafer) becomes larger. Accordingly, in order to obtain the desired optical performance, since spaces between the lenses and optical members such as reflectors which comprise the projection optical system do not vary significantly, the projection optical system as a whole becomes longer in its length, and keeping the projection optical system compact becomes difficult to realize.

Also, Condition (III), in the case where it basically comprises, viewed from the first object side, in order of succession, the first group of lenses with positive refractive power $G_1$, the second group of lenses virtually consists of afocal system $G_2$, and the third group of lenses with positive refractive power $G_3$, provides for, as shown in the following, the optimal ratio between the height of the paraxial marginal ray from the optical path when the paraxial marginal ray from the axial object point enters into the second group of lenses $G_2$ represented by $h_1$ and the height of the paraxial marginal ray from the optical axis when the paraxial marginal ray from the axial object point emerges from the second group of lenses $G_2$ represented by $h_2$.

$$4 \leq h_2/h_1 \leq 10 \quad (III)$$

Provided that what is designated as the paraxial marginal ray in the present invention is the most peripheral (outer) incoming ray found by the paraxial ray tracing when the ray emitted from the object point with a certain divergence angle enters the optical system.

This Condition (III) shortens the entire length of the lens system as well as making the radial direction of the entire lens system compact. In explaining Condition (III) in the following, the basic configuration of the projection optical system according to the present invention will be studied.

Figure 2:
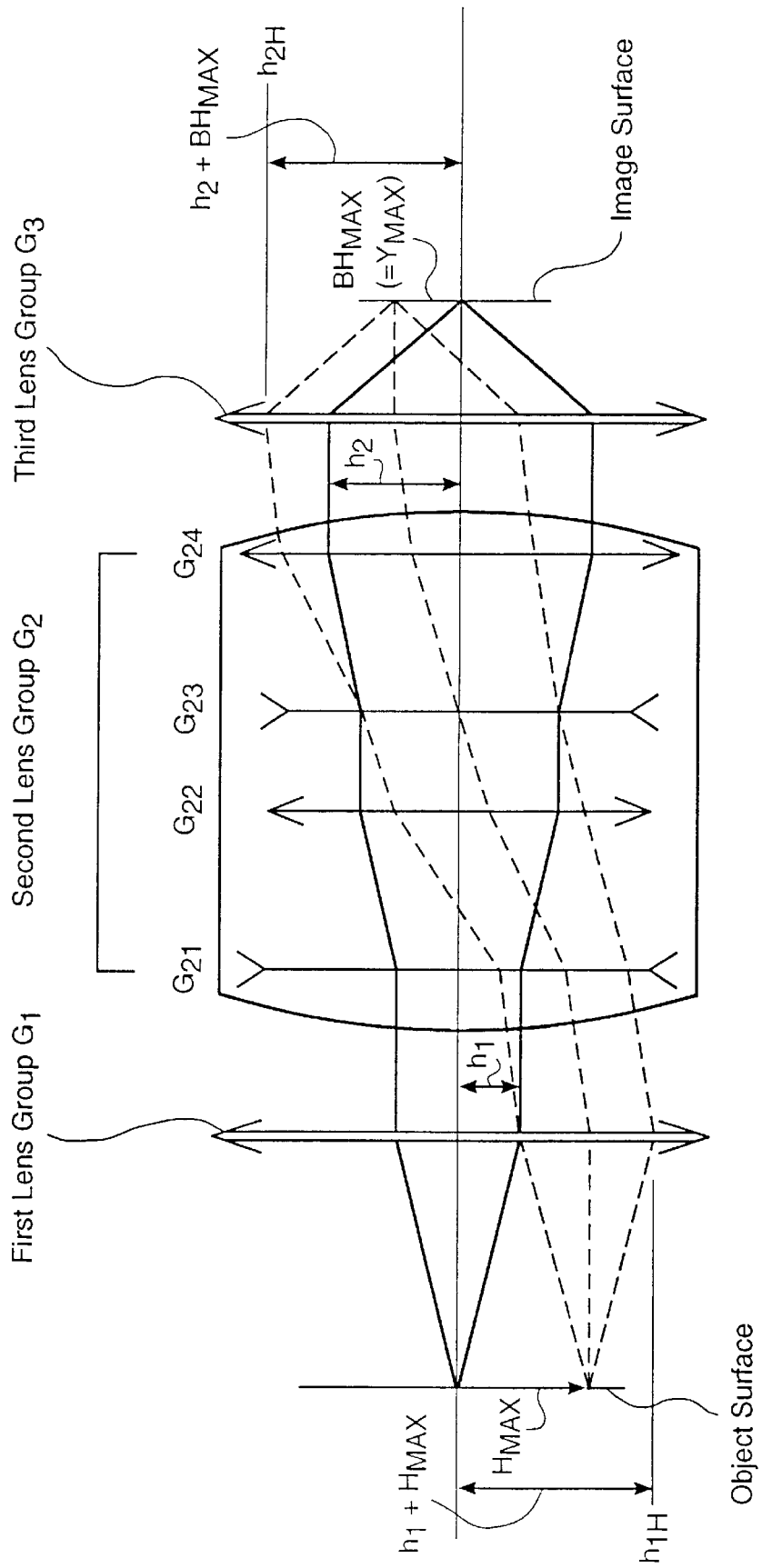
FIG. 2 shows a basic structure of the projection optical system according to the present invention.

As shown in FIG. 2, the projection optical system according to the present invention basically comprises, viewed from the object side (reticle side), in order of succession, the first group of lenses with positive refractive power $G_1$, the second group of lenses consists of the afocal system $G_2$, and the third group of lenses with positive refractive power $G_3$.

If the height of the paraxial marginal ray from the optical axis when the paraxial marginal ray (the ray shown in solid in FIG. 2) from the axial object point (object center) at the position where the object height H on the object (reticle) is zero (a position where the reticle and the optical axis of the projection optical system intersect). enters the second group of lenses $G_2$ is represented by $h_1$, and the height of the paraxial marginal ray from the optical axis when the paraxial marginal ray from the axial object point emerges from the second group of lenses $G_2$ is represented by $h_2$, then a lateral magnification $\beta$ of the second group of lenses $G_2$ is $$\beta = h_2/h_1 \quad (10),$$

and therefore, the imagery magnification B of the entire projection optical system should be as the following Eq. (11).

$$B = f_3/(f_1 \cdot \beta) \quad (11)$$

And if the maximum height of the paraxial marginal ray from the optical axis when the paraxial marginal ray (the ray shown in dash in FIG. 2) from the off-axis object point at the position of the maxim object height $H_{MAX}$ (an object height at a position farthest from the optical path) enters into the first group of lenses $G_1$ and the third group of lenses $G_3$ are represented by $h_{1H}$ and $h_{2H}$ respectively, then the following Eqs. (12) and (13) should hold.

$$h_{1H} = h_1 + H_{MAX} \quad (12)$$

$$h_{2H} = h_2 + B \cdot H_{MAX} \quad (13)$$

Conditions (12) and (13) are basically to provide for the maximum diameter of the entire projection optical system. In particular, the maximum entrance height of the paraxial marginal ray $h_{1H}$ when the paraxial marginal ray from the off-axis object point enters the first group of lenses $G_1$ at the position of the maximum object height $H_{MAX}$ as the paraxial marginal ray is to provide for a maximum lens diameter in the lens system on the object side (reticle side) of the projection optical system and the maximum entrance height of the paraxial marginal ray $h_{2H}$ from the off-axis object point at the position of the maximum object height $H_{MAX}$ when the paraxial marginal ray enters the third group of lenses $G_3$ is to provide for the maximum lens diameter of the lens system on the image side (wafer side) of the projection optical system.

If either one of these 2 maximum lens diameters ($h_{1H}$, $h_{2H}$) is increased, the height of the ray when it passes through each of the lens surfaces becomes higher, and it is not preferable since aberration of higher order will be generated. In concrete, if the maximum entrance height of the paraxial marginal ray $h_{1H}$ when the paraxial marginal ray from the off-axis object point at the maximum object height position $H_{MAX}$ enters the first group of lenses $G_1$ is heightened, then aberration of higher order due to the off-axis ray (image field curvature, coma aberration, and so on) will be generated, and if the maximum entrance height of the paraxial marginal ray $h_{2H}$ at the time when the paraxial marginal ray from the off-axis object point at the maximum object height position $H_{MAX}$ enters the third group of lenses $G_3$ is heightened, then aberration of higher order due to the axial ray (spherical aberration) which needs to be corrected in order to increase the numerical aperture on the image side (wafer side) of the projection optical system will be generated.

On the contrary, if either one of these 2 maximum lens diameters ($h_{1H}$, $h_{2H}$) is decreased, it will become inevitable to make the power (refractive power) of the positive lens in the projection optical system stronger, and owing to this, the correction of the image field curvature, in particular, will become difficult.

According to the above mentioned issues, in order to correct aberrations due to the off-axis ray and aberration due to the axial ray well proportionately, it is desirable to equalize these 2 maximum lens diameter ($h_{1H}$, $h_{2H}$), and enciphering this yields the following Eq. 14.

$$h_1 + H_{MAX} = h_2 + B \cdot H_{MAX} \qquad (14)$$

In the following, the reduction of the lens diameter of the entire projection optical system by means of reducing the two maximum lens diameter ($h_{1H}$, $h_{2H}$) is studied, and first of all, from the relation of the aforementioned Eq. (10), the following Eq. (15) and (16) should hold.

$$h_1 = h_2/\beta \qquad (15)$$

$$h_2 = h_1 \cdot \beta \qquad (16)$$

Therefore, transforming the above mentioned Eq. (15) and (16) using the above mentioned Eq. (14) eventually derives the following Eq. (17) and (18).

$$h_1 = \{(1-B)/(\beta-1)\} \cdot H_{MAX} \qquad (17)$$

$$h_2 = \{\beta/(\beta-1)\} \cdot (1-B) H_{MAX} \qquad (18).$$

From the above mentioned Eq. (17) and (18), it can be understood that, in order to keep the diameter of the entire projection optical system small, while correcting aberration due to off-axis ray and aberration due to the axial ray, making the right side of the Eq. (17) or (18) small would suffice. Therefore, if the imagery magnification B of the entire projection optical system and the maximum object height $H_{MAX}$ are fixed, in order to decrease the value of the right side per se while maintaining the value of the right side of the Eq. (17) and (18) positive, it is understood that increasing the value of $\beta$ (a ratio of the entrance height $h_1$ and the emergence height $h_2$ of the paraxial marginal ray from the axial object point with regard to the second group of lenses $G_2$) will suffice.

Therefore, the Condition (III) according to the present invention provides for, as described above, an absolute value of an optimal ratio of the entrance height $h_1$ and the emergence height $h_2$ of the paraxial marginal ray from the axial object point for the second group of lenses $G_2$ in order to keep the diameter of the entire projection optical system small, while well-proportionately correcting the aberrations due to both the off-axis ray and the axial ray and at the same time.

In the condition where it goes below the lower limit of Condition (III), if the entrance height $h_1$ of the paraxial marginal height from the axial object point in the second group of lenses $G_2$ against the emergence height $h_2$ of the paraxial marginal ray from the axial object point in the second group of lenses $G_2$ becomes too large, then the lens diameter on the object side (reticle side) of the projection optical system becomes large. Therefore, an attempt to reduce the lens diameter on the object side (reticle side) in the projection optical system in order to obtain the desired imagery magnification B, while keeping the lateral magnification ($h_2/h_1$) of the second group of lenses $G_2$ uniform causes the entrance height $h_2$ at the time when the paraxial marginal ray from the axial object point emerges from said second group of lenses $G_2$ to become small. As a result, since the focal length of the third group of lenses $G_3$ becomes short, it will become difficult to correct aberration due to the axial ray (spherical aberration), and thus it will become difficult to increase the aperture stop NA on the image side of the projection optical system. Then, a further attempt to correct aberration due to the axial ray (spherical aberration) better causes the number of lenses to compose the third group of lenses $G_3$ to increase, and thus the entire length of the projection optical system will increase. On the contrary, in the condition where Condition (III) is surpassed, if the emergence height $h_1$ of the paraxial marginal ray from the axial object point in the second group of lenses $G_2$ becomes too high for the entrance height $h_1$ of the paraxial marginal ray from the axial object point in the second group of lenses $G_2$, then the lens diameter on the image side (wafer side) in the projection optical system will increase. Therefore, an attempt to reduce the lens diameter on the image side (wafer side) in this projection optical system in order to obtain the desired imagery magnification B, while keeping the lateral magnification ($h_2/h_1$) of the second group of lenses $G_2$ uniform causes the entrance height $h_1$ at the time when the paraxial marginal ray from the axial object point enters said second group of lenses $G_2$ to become small. As a result, since the focal length of the first group of lenses $G_1$ becomes short, it will become difficult to correct aberration due to the off-axis ray (image field curvature, coma aberration, etc.). And then, a further attempt to correct aberration due to the off-axis ray (image field curvature, coma aberration) better causes a need to increase the number of lenses to compose the first group of lenses $G_1$, and the entire length of the projection optical system becomes longer.

Also, in order to realize to keep the system compact further satisfactorily, it is preferable to further satisfy the following Condition (IV) besides Condition (I)~(III).

$$0.05 \leq f_1/L \leq 0.3 \qquad (IV)$$

Provided that $f_1$ expresses the focal length of the first group of lenses $G_1$ and L expresses the distance (the distance from the object to the image) between the first object (reticle) and the second object (wafer).

Condition (IV) warrants to shorten the entire length of the projection optical system by providing for the optimal ratio of the focal length $f_1$ of the first group of lenses and the distance between the object and the image L.

When going below the lower limit of Condition (IV), because the power (refractive power) of the first group of lenses $G_1$ becomes too strong for the distance between the object and the image L, it will become difficult to correct various aberrations. On the contrary, when surpassing the upper limit of Condition (IV), since the overall length of the projection optical system becomes longer, it will become difficult to keep the projection optical system compact.

Also, in order to shorten the overall length of the projection optical system sufficiently, it is desirable to satisfy the following Condition (V).

$$0.04 \leq H_{MAX}/L \leq 0.2 \qquad (V)$$

Provided that $H_{MAX}$ expresses the maximum object height (a half length of the diagonal line within the available pattern region on the reticle) from the optical axis of the projection optical system on the first object (reticle), and L expresses the distance between the first object (reticle) and the second object (wafer) (the distance between the object and the image).

Condition (V) is to provide for the optimal ratio of the distance between the object and the image Ls for the maximum object height $H_{MAX}$. Even though the values of the above mentioned Condition (II) are fixed, if the distance between the object and the image L against the maximum object height $H_{MAX}$ becomes longer, going below the lower limit of Condition (V), because the overall length of the projection optical system becomes too long, it will become impossible to attempt to keep the system compact. On the contrary, surpassing the upper limit of Condition (V) makes it difficult to correct various aberrations over the entire image formation field (the entire wafer surface) well.

Furthermore, in order to correct various aberrations proportionately while maintaining the degree of freedom in correcting various aberrations, it is desirable that the first group of lenses $G_1$ comprises at least 2 or more positive lenses, the second group of lenses $G_2$ comprises at least 4 or more negative lenses and at least 4 or more positive lenses, and the third group of lenses $G_3$ comprises at least 2 or more positive lenses.

So far, the projection optical system based on the groups of lenses comprising, viewed from the object side (reticle side), in order of succession, the first group of lenses $G_1$ with positive refractive power, the second group of lenses $G_2$ consists of afocal systems, and the third group of lenses $G_3$ with positive refractive power, has been described, and in order to keep the overall size of the projection optical system compact based on the configuration of the second group of lenses $G_2$, and further to correct the image field curvature well, it is desirable to make it composed of, as shown in FIG. 2, viewed from the object side (reticle side), in order of succession, at least a first group of sub lenses with negative refractive power $G_{21}$, a second group of sub lenses with positive refractive power $G_{22}$, and a third group of sub lenses with negative refractive power $G_{23}$.

First of all, the negative first group of sub lenses $G_{21}$ in this second group of lenses $G_2$ and the positive second group of sub lenses $G_{22}$ place a principal plane on the image side (wafer side) and shorten the distance from the object plane (reticle plane) to the projection optical system, and thus shorten the overall length of the projection optical system in order to form the reverse-Galileo system (or retro-focus system). Also, the third group of sub lenses $G_{23}$ in the second group of lenses $G_2$ smoothes the image field by satisfactorily correcting the image field curvature in order to contribute mainly to the correction of Petzval sum.

Furthermore, because there is a danger that the entrance pupil of the projection optical system comes closer to the object plane (reticle plane) due to the configuration of the above mentioned first group of sub lenses $G_{21}$ and the second group of sub lenses $G_{22}$, it is desirable, in this case, to match the secondary focal point (the image side or the wafer side) of the positive first group of lenses $G_1$ with the entrance pupil position of the projection optical system at approximately the same time thereof, and by doing so, it is possible to place the entrance pupil position of the projection optical system farther than the object plane (reticle plane) while keeping the overall length of the projection optical system short.

In order to have the second group of lenses $G_2$ function to correct aberration satisfactorily while keeping the system compact enough, based on the basic configuration of the above mentioned second group of lenses $G_2$, if a focal length of the first group of sub lenses $G_{21}$ is represented by $f_{21}$, a focal length of the second group of sub lenses $G_{22}$ is represented by $f_{22}$, and a focal length of the third group of the sub lenses $G_3$ is represented by $f_{23}$, then it is desirable to further satisfy the following conditional Eqs. (VI) and (VII).

$$1.5 \leq |f_{22}/f_{21}| \leq 5 \qquad \text{(VI)}$$

$$0.02 \leq |f_{23}/L| \leq 0.10 \qquad \text{(VII)}$$

Condition (VI) corresponds to giving the optimal magnification for the first group of sub lenses $G_{21}$ that comprises the reverse Galileo system (or retro focus system) and the second group of sub lenses $G_{22}$, and it is a condition to keep the overall length of the projection optical system compact. Going below the lower limit of Condition (IV) makes it difficult to keep the projection optical system compact. Furthermore, in order to satisfactorily keep the system compact, supposing the lower limit value of Condition (VI) is 1.7, then it is desirable if $1.7 \leq |f_{22}/f_{21}|$. On the contrary, surpassing the upper limit of Condition (VI) causes the focal length $f_{21}$ of the first group of sub lenses $G_{21}$ to become short, and it will become extremely difficult to correct various aberrations, and even if the focal length $f_{21}$ of the first group of sub lenses $G_{21}$ is fixed, the focal length $f_{22}$ of the second group of sub lenses $G_{22}$ will become longer, and thus the system will not be satisfactorily kept compact.

Also, Condition (VII) is a condition to have the third group of lenses $G_{23}$ function to correct Petzval sum satisfactorily. Going below the lower limit of Condition (VII) causes the focal length $f_{23}$ of the third group of sub lenses $G_{23}$ to become too short, and it will become difficult to correct various aberrations, and on the contrary, surpassing the upper limit of Condition (VII) causes the Petzval sum to be corrected insufficiently, and it will become difficult to smooth the image field.

Furthermore, it was previously described to the effect that, in order to correct various aberrations while maintaining a degree of freedom in correcting various aberrations, it is preferable to have such a configuration where the second group of lenses $G_2$ has at least 4 or more negative lenses and at least 4 or more positive lenses, and a more preferable configuration of the second group of lenses $G_2$ would comprise the first group of sub lenses $G_{21}$ with at least 2 or more negative lenses, the second group of sub lenses $G_{22}$ with at least 4 or more positive lenses, and the third group of sub lenses $G_{23}$ with at least 2 or more negative lenses.

What is furthermore preferable would be that at least 2 positive lenses out of 4 or more positive lenses in the second group of sub lenses $G_{22}$ are biconvex lenses.

Incidentally, although the second group of lenses $G_2$ according to the present invention composes an afocal system, it does not necessarily have to be the perfect afocal system.

Hence to be concrete, when the paraxial marginal ray is traced, with the position where the object height H on the object (reticle) is zero (the position where the reticle and the optical axis of the projection optical system intersect) as the axial object point, in the region closest to the object side (reticle side) where the variation of the angle of the slope of the paraxial marginal ray initially becomes small, if the point between the lenses where the angle of the slope of the paraxial marginal ray becomes either zero or closest to zero is designated as a boundary between the first group of lenses $G_1$ and the second group of lenses $G_2$, and in the region closest to the image side (wafer side) where the variation of the angle of the slope of the paraxial marginal ray finally becomes small, if the point between the lenses where the angle of the slope of the paraxial marginal ray becomes either zero or closest to zero is designated as a boundary between the second group of lenses $G_2$ and the third group of lenses $G_3$, then the second group of lenses $G_2$ in that case will be included in the definition of the afocal system connoted by the present invention.

Figure 3:
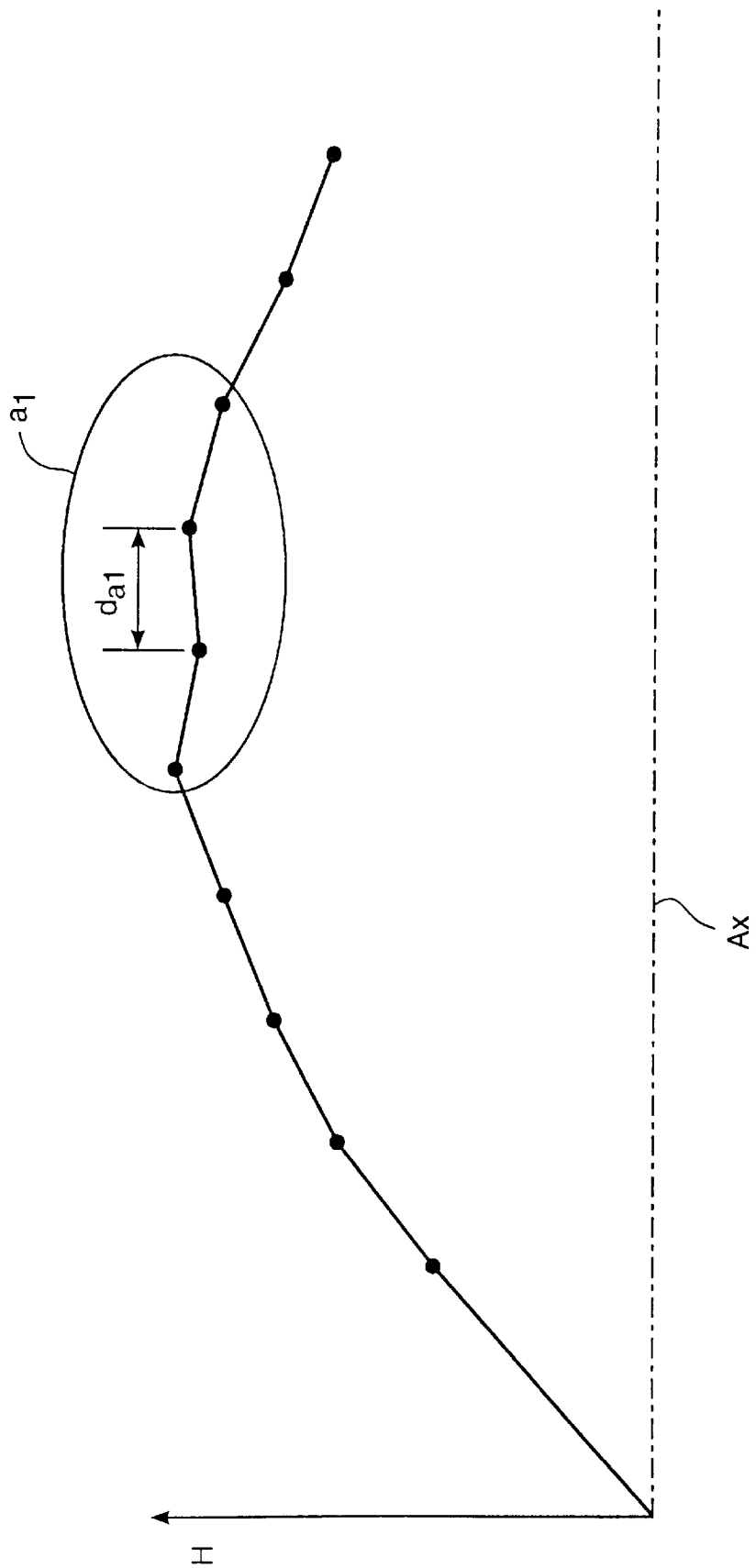
FIG. 3 qualitatively shows the slope of the light path of the paraxial marginal ray when the paraxial marginal passes through lens surfaces, showing peak values in the region closest to the object side (reticle side) where the variation of the angle of the slope of the paraxial marginal ray from the axial object point (reticle center) initially becomes small.
Figure 4:
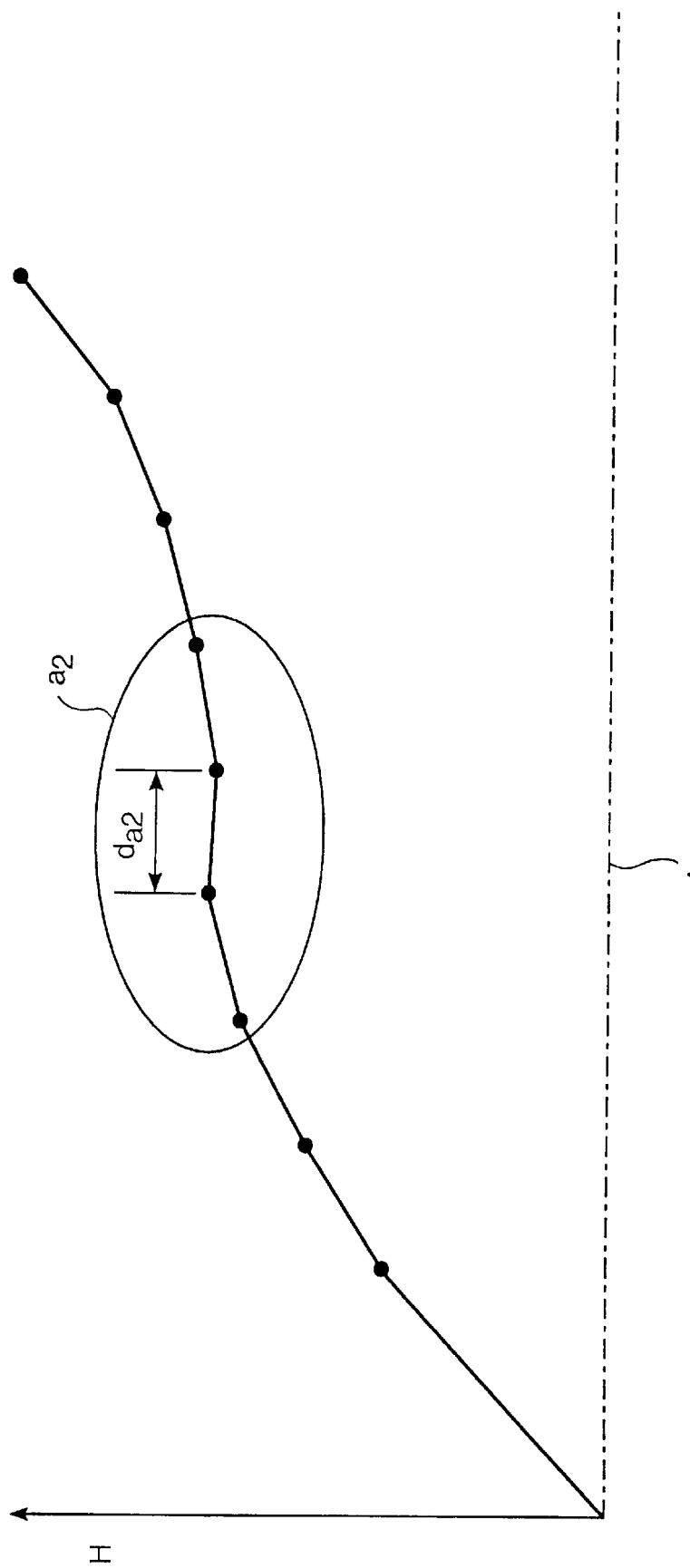
FIG. 4 qualitatively shows the slope of the light path of the paraxial marginal ray when the angle of the slope of the paraxial marginal ray is in its tendency to increase in the region closest to the object side (the reticle side) where the variation of the angle of the slope of the paraxial marginal ray from the axial object point (reticle center) initially becomes small.

Therefore, in order to make it easier to understand the afocal system of the second group of the lenses $G_2$ connoted by the present invention, the division of the first group of lens $G_1$~the third group of lenses $G_3$ will be explained in reference to FIG. 3~FIG. 6. FIG. 3 and 4 qualitatively show the optical path of the paraxial marginal ray at the time when the paraxial marginal ray is traced in the region $(a_1, a_2)$ closest to the object side (reticle side) where the variation of the angle of the slope of the paraxial marginal ray initially becomes small, and FIG. 5 and 6 qualitatively show the optical path of the paraxial marginal ray in the region $(b_1, b_2)$ closest to the image side (wafer side) where the variation of the angle of the slope of the paraxial marginal ray finally becomes small. This is provided that the points plotted in the optical path of the paraxial marginal ray in FIG. 3~6 connote the position at each of the surfaces of lenses in the projection optical system where the paraxial marginal ray from the optical axis Ax passes through.

First of all, FIG. 3 shows the slope of the paraxial marginal ray at or near the position where the paraxial marginal ray passes through each of the lenses of the projection optical system, initially showing a peak value, when the region $a_1$ where the variation of the angle of the slope of the paraxial marginal ray becomes small, is included. In this case, it is preferable if the boundary between the first group of lenses $G_1$ and the second group of lenses $G_2$ is at a position $d_{a1}$ in the space between lenses where the angle of the slope of the paraxial marginal ray is either zero or closest to zero in the region $a_1$.

FIG. 4 shows the slope of the paraxial marginal ray when the angle of the slope of the paraxial marginal ray is in its tendency to increase in the condition where the region $a_2$ where the variation of the angle of the slope of the paraxial marginal ray entering into each of the lenses of the projection optical system initially becomes small is included in the region close to the object side (reticle side) of the projection optical system. In this case, it is preferable if the boundary between the first group of lenses $G_1$ and the second group of lenses $G_2$ is at a position $d_{a2}$ in the space between lenses where the angle of the slope of the paraxial marginal ray is either zero or closest to zero in the region $a_2$.

Figure 5:
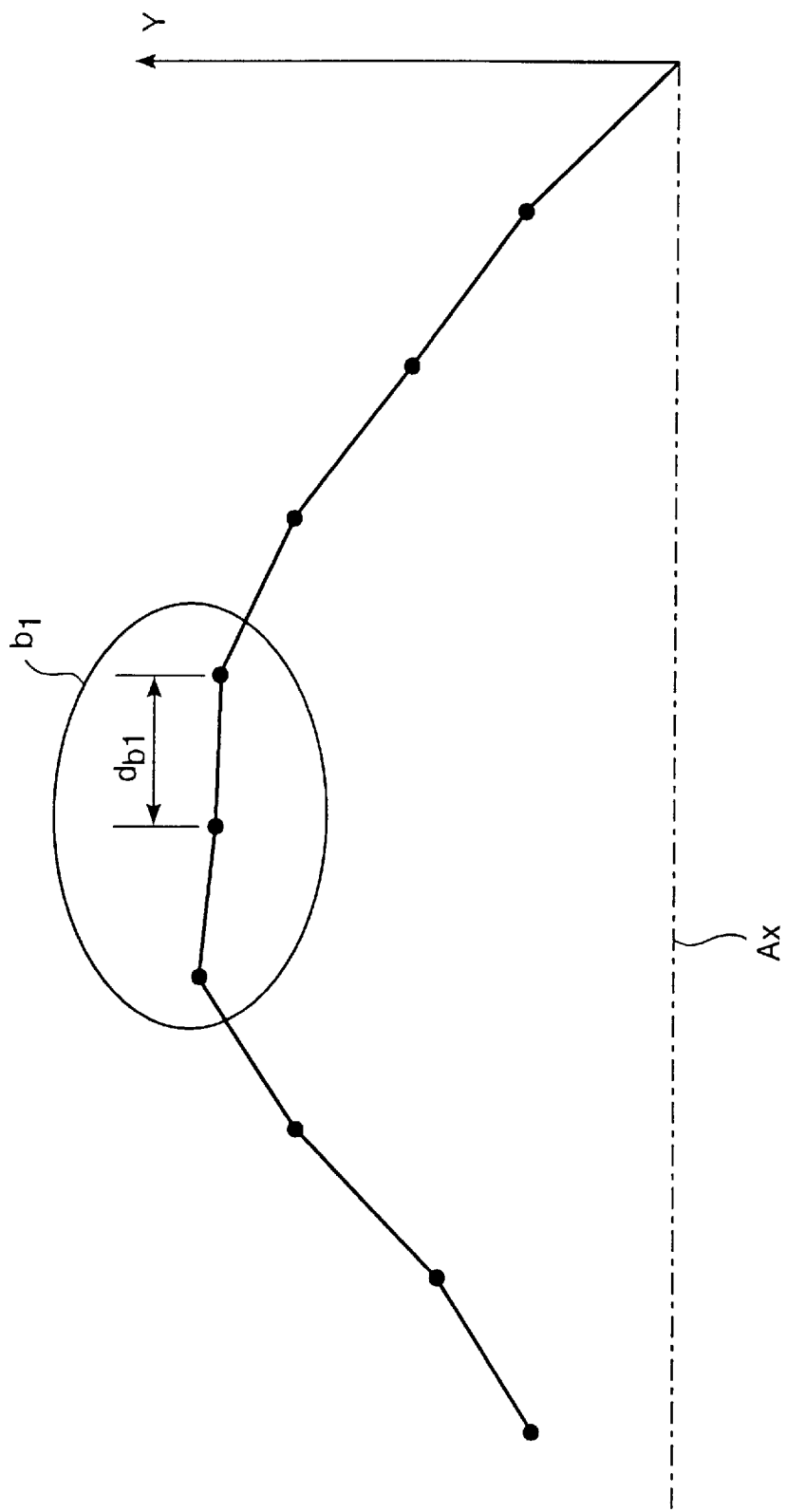
FIG. 5 qualitatively shows the slope of the light path of the paraxial marginal ray when the paraxial marginal ray passes through lens surfaces, showing peak values, in the region closest to the image side (wafer side) where the variation of the angle of the slope of the paraxial marginal ray from the axial object point (reticle center) finally becomes small.

FIG. 5 shows the slope of the paraxial marginal ray when the region $b_1$ where the variation of the angle of the slope of the paraxial marginal ray becomes small is included, at or near the position where the paraxial marginal ray enters each of the lenses of the projection optical system, lastly showing a peak value. In this case, it is preferable if the boundary between the second group of lenses $G_2$ and the third group of lenses $G_3$ is at a position $d_{b1}$ between the lenses where the angle of the slope of the paraxial marginal ray becomes either zero or closest to zero in the region $b_1$.

Figure 6:
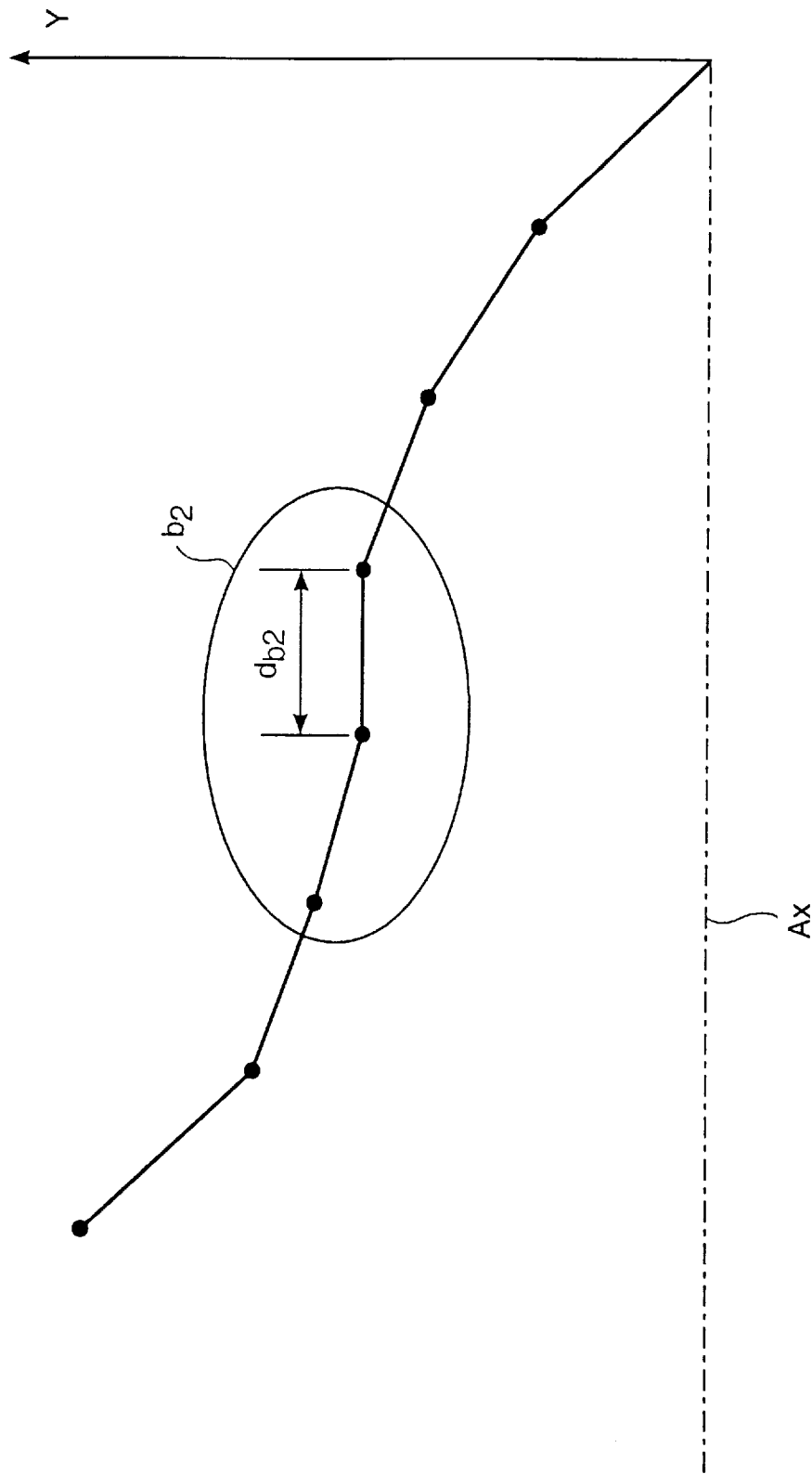
FIG. 6 qualitatively shows the slope of the light path of the paraxial marginal ray when the angle of the slope of the paraxial marginal ray is in its tendency to decrease in the region closest to the image side (wafer side) where the variation of the angle of the slope of the paraxial marginal ray initially becomes small.

FIG. 6 shows the slope of the paraxial marginal ray when the angle of the slope of the paraxial marginal ray is in its tendency to decrease in the condition where the region $b_2$ where the variation of the angle of the slope of the paraxial marginal ray entering each of the lenses of the projection optical system lastly becomes small is included in the region close to the image side (wafer side) of the projection optical system. In this case, it is preferable if the boundary between the second group of lenses $G_2$ and the third group of lenses $G_3$ is at a position $d_{b2}$ between the lenses where the angle of the slope of the paraxial marginal ray becomes either zero or closest to zero.

In order to have the second group of lenses $G_2$ function as an afocal system sufficiently based on the above mentioned lens configurations of the first group of lenses $G_1$~the third group of lenses $G_3$, if the angle of incidence of the paraxial marginal ray when the paraxial marginal ray from the axial object point on the object (reticle) enters the first group of lenses $G_1$ is represented by $u_1$, the angle of incidence of the paraxial marginal ray when the paraxial marginal ray from the axial object point on the object (reticle) enters the second group of lenses $G_2$ is represented by $u_2$, the angle of emergence of the paraxial marginal ray when the paraxial marginal ray from the axial object point on the object (reticle) emerges from the second group of lenses $G_2$ is represented by $u_2'$, the angle of emergence of the paraxial marginal ray when the paraxial marginal ray on the object (reticle) emerges from the third group of lenses $G_3$ is represented by $u_3'$, then it is desirable to satisfy the following equations.

$$|u_2/u_1| \leq 0.5 \tag{VIII}$$

$$|u_2'/u_3'| \leq 0.5 \tag{IX}$$

Unless conditional equations (VII) and (IX) are satisfied, it will become difficult to correct aberrations due to the angle of view (image field curvature, astigmatic aberration, coma aberration and distortion aberration) and aberrations relating to the numerical aperture NA on the image side of the projection optical system (spherical aberration) well-proportionately, and it will be impossible to realize the kind of the projection optical system of which the present invention designated as its objective.

Furthermore, in order to have the second group of lenses $G_2$ function sufficiently as an afocal system, if the focal length of the first group of the lenses $G_1$ is represented by $f_1$, the focal length of the second group of lenses $G_2$ is represented by $f_2$, and the focal length of the third group of lenses $G_3$ is represented by $f_3$, then it is furthermore desirable to satisfy $$|f_2| > f_1 \tag{X}$$

$$|f_2| > f_3 \tag{XI}.$$

Unless Condition (X) is satisfied, it will be difficult to make the object side (reticle side) in the first group of the lenses $G_1$ telecentric, and the kind of the projection optical system of which the present invention designated as its objective cannot be attained.

Also, in the case when the focal length of the second group of lenses $G_2$ is negative, deviating from the relation of Condition (XI), the paraxial marginal ray which emerges from the second group of lenses $G_2$ will diverge. Because of this, the numerical aperture NA on the image side (wafer side) of the projection optical system becomes smaller, and it will become difficult to realize the projection optical system with high resolution. And the attempt to secure the numerical aperture NA on the image side (wafer side) of the projection optical system will increase the lens diameter of the third group of the lenses $G_3$, and it will be difficult to keep the system compact. Also, when the focal length of the second group of lenses becomes positive, deviating from the relationship of Condition (XI), although it is possible to secure the numerical aperture NA on the image side (wafer side) of the projection optical system, it will become impossible to secure the distance (back focus) between the projection optical system and the image field (wafer plane), and thus it is not preferable. Because of this, an attempt to secure the distance (back focus) between the projection optical system and the image field (wafer plane) brings an increase in the lens diameter of the second group of the lenses $G_2$, and thus the system cannot be kept compact.

Furthermore, as it was described before, it is preferable that the second group of the lenses $G_2$ comprises, viewed from the object side (reticle side), in order of succession, at least the first group of sub lenses with negative refractive power $G_{21}$, the second group of sub lenses with positive refractive power $G_{22}$, and the third group of sub lenses with negative refractive power $G_{23}$, but as shown in FIG. 2, it is also acceptable to place the fourth group of sub lenses with positive refractive power $G_{24}$ on the image side of the third group of sub lenses with negative refractive power $G_{23}$. By doing so, because it will be made possible to share the load with the fourth group of sub lenses $G_{24}$ in correcting spherical aberration in the third group of lenses $G_3$ which is greatly related to the correction of spherical aberration for the purpose of increasing the numerical aperture NA on the image side (wafer side) of the projection optical system, a well-balanced correction of spherical aberration can be attained. At that time, the first group of sub lenses $G_{21}$ and the second group of sub lenses $G_{22}$ compose the reverse Galileo system or retro-focus system, and the third group of sub lenses $G_{23}$ and the fourth group of sub lenses $G_{24}$ compose the reverse Galileo system or retro focus system. Therefore, since the second group of lenses $G_2$ comes to have two optical systems (reverse Galileo system or retro focus system) which contribute to keep the projection optical system compact, the addition of the fourth group of lenses $G_{24}$ does not virtually cause the size of the projection optical system to grow.

Furthermore, even in the case where the second group of lenses $G_2$ has four groups of sub lenses, it is needless to say that the above mentioned Conditions (I)~(XI) can still be applied, and furthermore, when the fourth group of sub lenses $G_{24}$ is placed in the second group of lenses, it is more preferable that the composition comprises at least two or more positive lenses in order to accomplish a satisfactory correction of spherical aberration.

Also, in the case where the second group of lenses $G_2$ comprises, viewed from the object side (reticle side), in order of succession, only the first group of sub lenses with negative refractive power $G_{21}$, the second group of sub lenses with positive refractive power $G_{22}$ and the third group of sub lenses with negative refractive power $G_{23}$, it is possible to make the ray emerging from the third group of lenses $G_{23}$ an almost parallel pencil of ray by making the ray emerging from the second group of lenses $G_{22}$ rather convergent. In this case, the application of the above mentioned Conditions (I)~(IX) is also possible. Accordingly, the lens composition of the fourth group of sub lenses $G_{24}$ is not essential in concretely composing the second group of lenses.

In the following, embodiments according to the present invention will be described in detail. The projection optical system in this embodiment is what is applied to the projection exposure apparatus shown in FIG. 7.

Figure 7:
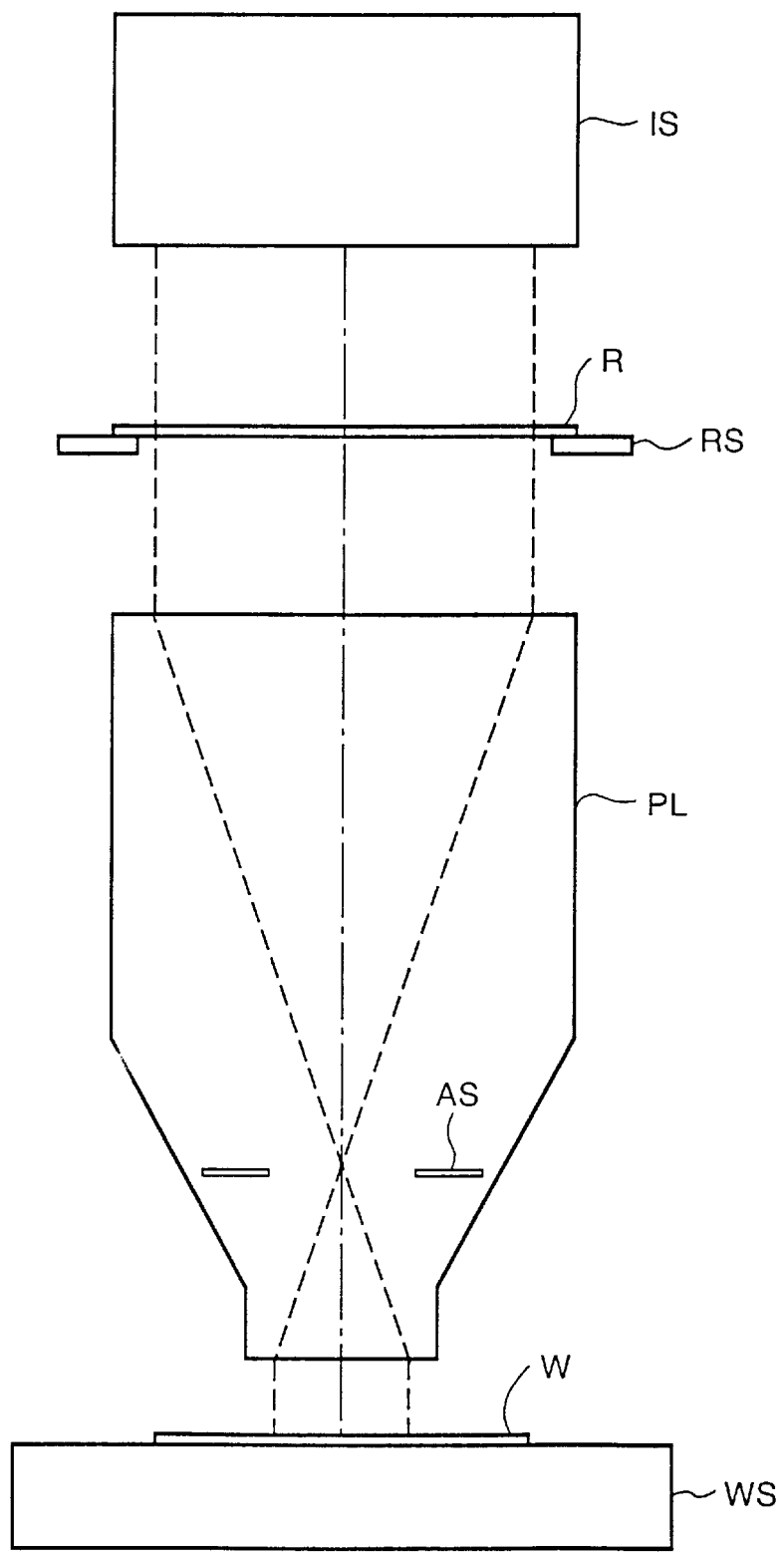
FIG. 7 shows a schematic structure of the projection exposure apparatus when the projection optical system according to the present invention is applied thereto.

First of all, to explain FIG. 7 briefly, as shown in the figure, a reticle R as an original edition for projection on which the fixed integrated circuit pattern is formed is placed on the object plane of the projection optical system PL, and a wafer W as a substrate is placed on the image field of the projection optical system PL. The reticle R is supported by a reticle stage RS, and the wafer W is supported by a wafer stage WS. Also, an illumination optical apparatus IS is installed above the reticle R in order to illuminate the reticle R evenly.

The light supplied from the illumination optical system IS according to the above mentioned configuration illuminates the reticle R, and the image of the light source in the illumination optical system IS is formed at the pupil position (aperture stop AS position) of the projection optical system PL, and thus so-called Koehler illumination is provided. And the pattern on the reticle R which is Koehler illuminated by the projection optical system PL will be exposed (printed) onto the wafer W by the projection optical system PL.

Figure 8:
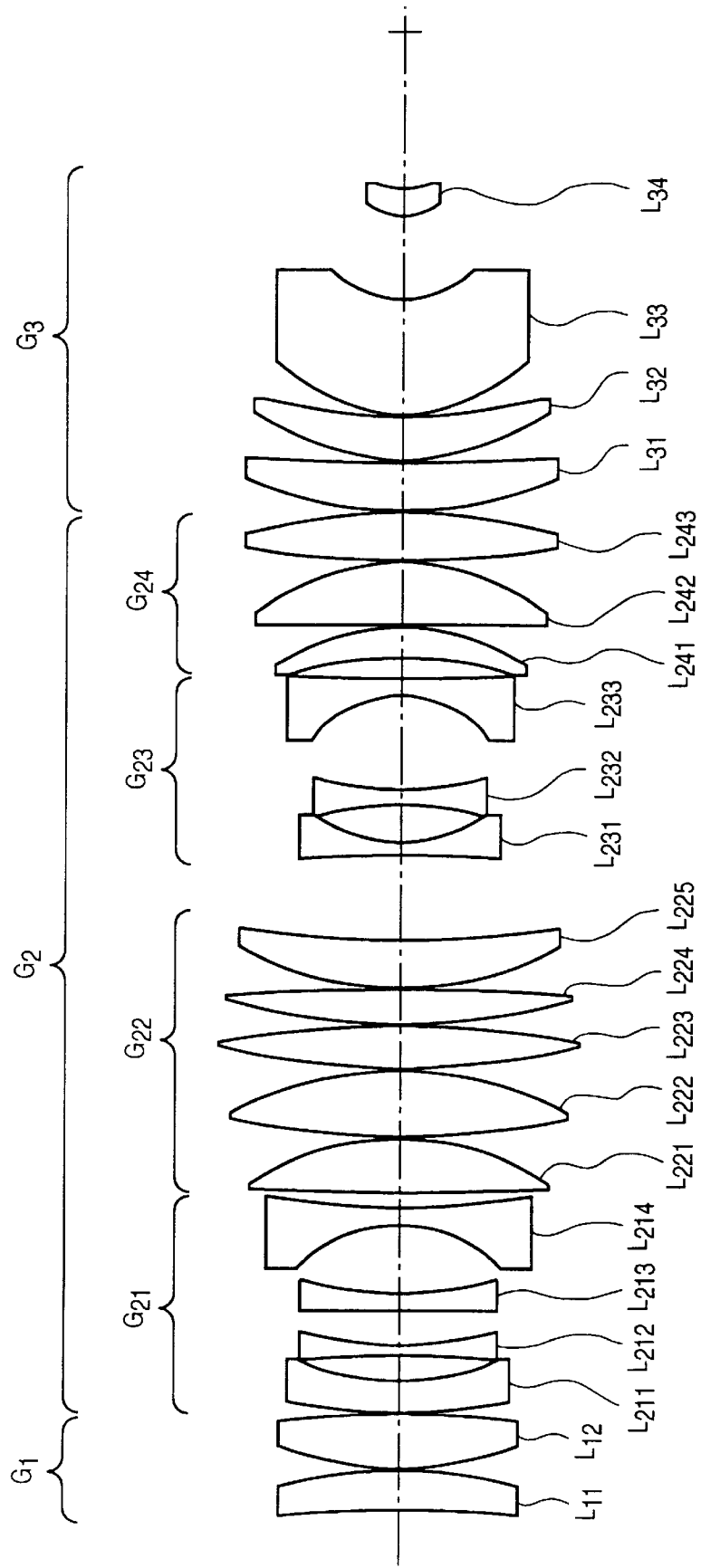
FIG. 8 shows the lens structure of the first embodiment according to the present invention.
Figure 9:
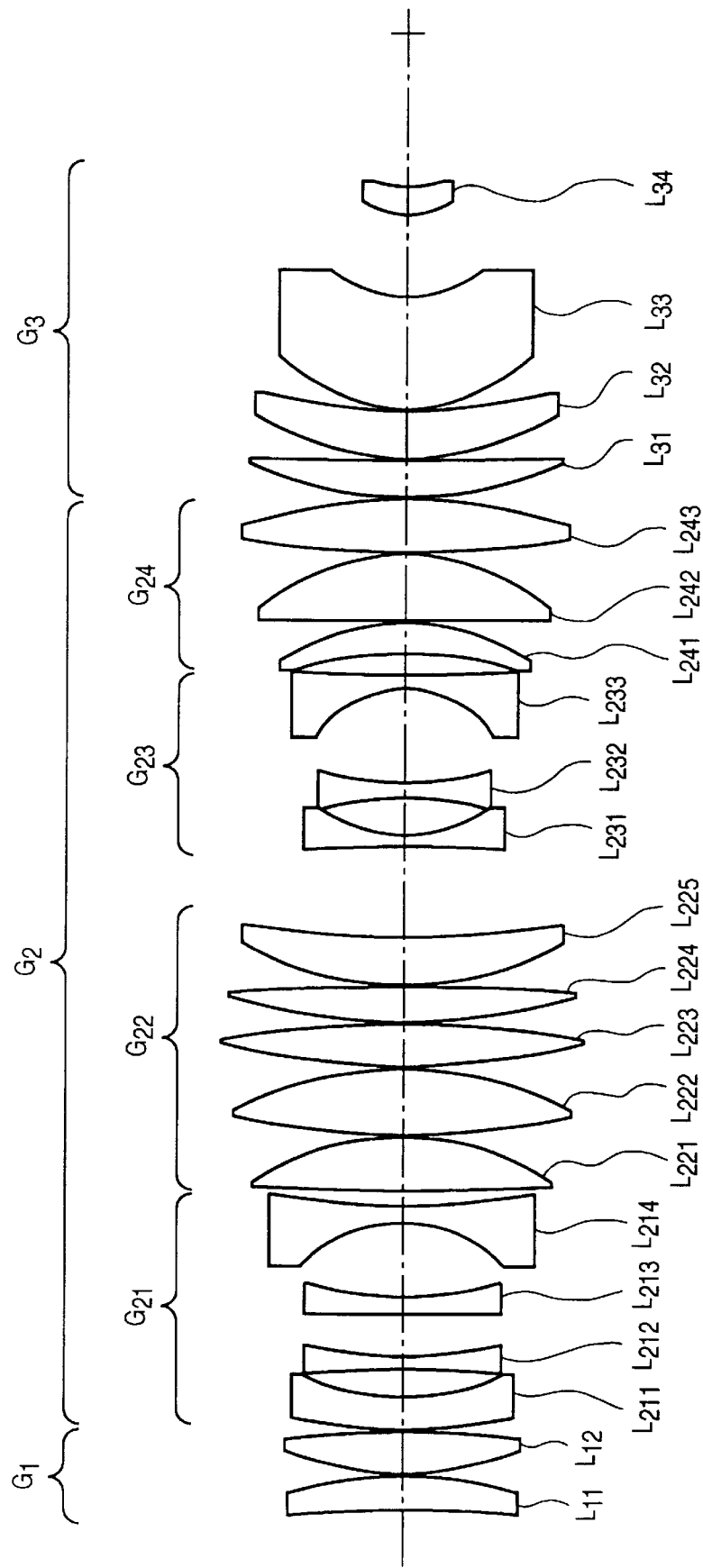
FIG. 9 shows the lens structure of the second embodiment according to the present invention.
Figure 10:
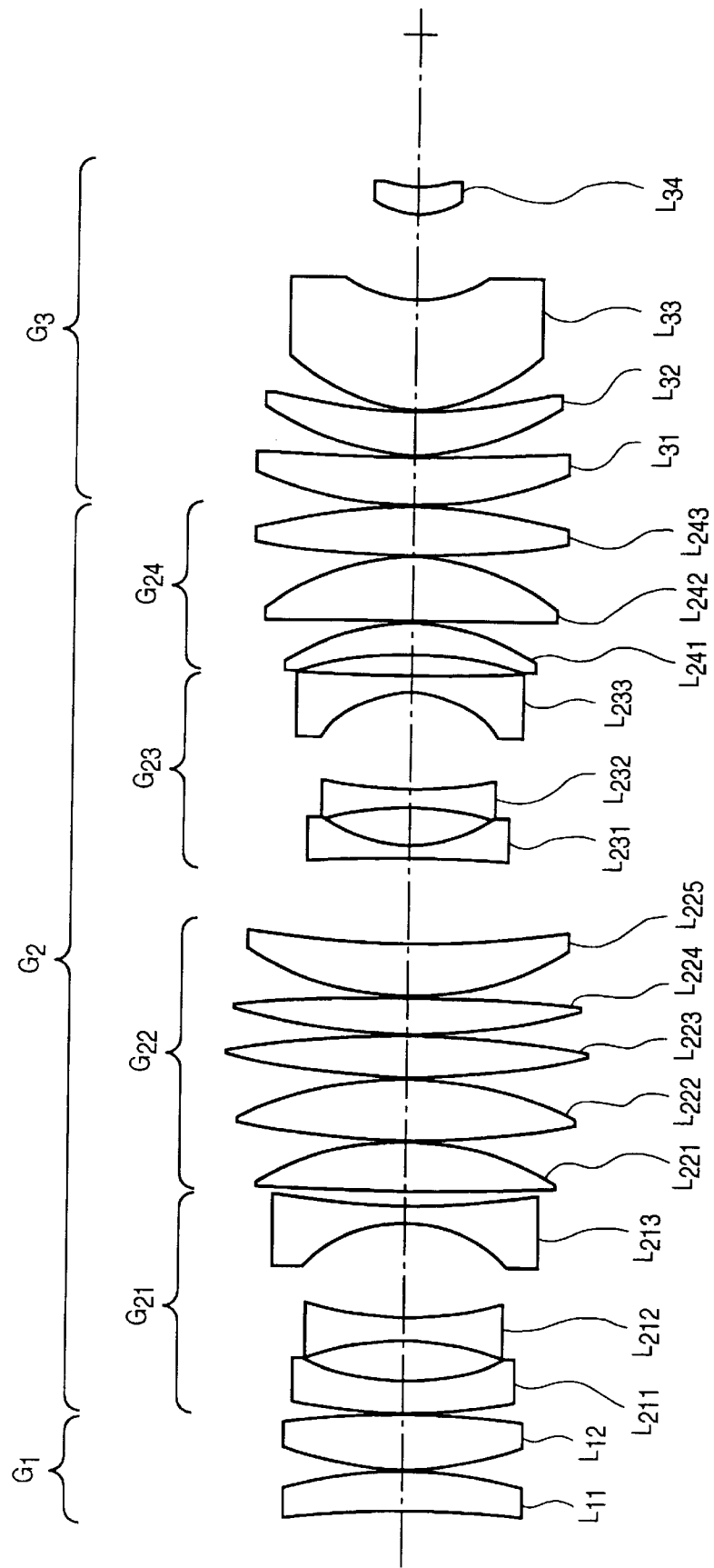
FIG. 10 shows the lens structure of the third embodiment according to the present invention.

The present embodiments show examples of the projection optical system which uses excimer laser which supplies the light with 248 nm exposure wavelength $\lambda$ as a light source, which is installed inside the illumination optical system IS, and FIG. 8~10 show the configuration of the lenses of the projection optical system of the 1st~3rd embodiments.

As shown in FIG. 8~10, the projection optical system in each of the embodiments has, viewed from the object side (reticle side), in order of succession, the first group of lenses with positive refractive power $G_1$, the second group of lenses consists of afocal systems $G_2$, and the third group of lenses with positive refractive power $G_3$, and the second group of lenses $G_2$ has, viewed from the object side (reticle side), in order of succession, the first group of sub lenses with negative refractive power $G_{21}$, the second group of sub lenses with positive refractive power $G_{22}$, the third group of sub lenses with negative refractive power $G_{23}$, and the fourth group of sub lenses with positive refractive power $G_{24}$, and it is telecentric on the object side (reticle side) as well as on the image side (wafer side).

First of all, the projection optical system as in the first embodiment shown in FIG. 8 has a spec. which stipulates that the distance between the object and image L (the distance from the object plane to the image field, or the distance from the reticle R to the wafer W) is 1000, the numerical aperture NA on the image side is 0.57, the projection magnification B is 1/4, and the diameter of the exposure area over the wafer W is 24.6.

To explain the concrete lens configuration of the first embodiment, as shown in FIG. 8, the first group of lens with positive refractive power $G_1$ comprises, viewed from the object side, in order of succession, a positive meniscus lens with its convex facing the image side $L_{11}$ and a biconvex positive lens $L_{12}$, and the first group of sub lenses $G_{21}$ in the second group of lenses $G_2$ comprises, viewed from the object side, in order of succession, a negative meniscus lens with its stronger curvature facing the image side $L_{211}$, the negative biconcave lens $L_{212}$, a negative lens with its stronger curvature facing the image side $L_{213}$, and a negative lens with its stronger curvature facing the object side $L_{214}$. And the second group of sub lenses $G_{22}$ in the second group of lenses $G_2$ comprises, viewed from the object side, in order of succession, a positive lens with its stronger curvature facing the image side $L_{221}$, three positive biconvex lenses ($L_{222}$~$L_{224}$), and a positive meniscus lens with its convex facing the object side $L_{225}$, and the third group of sub lenses $G_{23}$ in the second group of lenses $G_2$ comprises, viewed from the object side, in order of succession, a negative lens with its stronger curvature facing the image side $L_{231}$, a negative biconcave lens $L_{232}$, and a negative lens with its stronger curvature facing the object side $L_{233}$. The fourth group of the sub lenses $G_{24}$ in the second group of the lenses $G_2$ comprises, viewed from the object side, in order of succession, two positive lenses with their convex facing the image side ($L_{241},L_{242}$) and a positive biconvex lens $L_{243}$, and the third group of lenses $G_3$ comprises, viewed from the object side, in order of succession, two positive lenses with their convex facing the object side ($L_{31},L_{32}$), a negative meniscus lens with its convex facing the object side $L_{33}$, and a positive lens with its convex facing the object side $L_{34}$.

Next, the projection optical system in the second embodiment, shown in FIG. 9, has a spec. that stipulates that the distance between the object and the image L is 1000, the numerical aperture NA on the image side is 0.59, the projection magnification B is 1/4, and the diameter of the exposure area on the wafer W is 24.4.

A concrete lens configuration of the second embodiment is, as shown in FIG. 9, basically the same as that of the first embodiment shown previously in FIG. 8.

Also, the projection optical system in the third embodiment shown in FIG. 10 has a spec. that stipulates that the distance between the object and the image L is 1000, the numerical aperture NA on the image side is 0.56, the projection magnification B is 1/4, and the diameter of the exposure area on the wafer W is 24.4.

A concrete lens configuration of the third embodiment is, as shown in FIG. 10, similar to the aforementioned first and second embodiments but different in its lens configuration of the first group of sub lenses $G_{21}$ in the second group of lenses $G_2$. In other words, in the first as well as the second embodiments, the first group of sub lenses $G_{21}$ comprises 4 negative lenses, but in the third embodiment shown in FIG. 10, the first group of sub lenses $G_{21}$ comprises three negative lenses.

Hence to be concrete, the first group of sub lenses $G_{21}$ in the third embodiment comprises, viewed from the object side, in order of succession, a negative meniscus lens with its convex facing the object side $L_{211}$, a negative biconcave lens $L_{212}$, and a negative lens with its stronger curvature facing the object side $L_{213}$.

Now in the following, various values of each of the embodiments and the numeric values corresponding to Conditions according to the present invention will be listed.

Provided that the numbers on the left express the order of succession from the object side (reticle side), r expresses a curvature radius of the lens surface, d expresses the space between the lens surfaces, n expresses a refractive index of fused silica $SiO_2$ when the exposure wavelength $\lambda$ is 248 nm, $d_0$ expresses the distance from the object (reticle) to the lens surface (the first lens surface) closest to the object side (reticle side) in the first group of lenses $G_1$, B expresses the projection magnification ratio of the projection optical system, NA is a numerical aperture on the image side of the projection optical system, F is the focal length of the entire system, L expresses the distance between the object and the image from the object plane (reticle plane) to the image field (wafer plane), $h_1$ expresses the entrance height of the paraxial marginal ray from the axial object point (reticle center) on the object (reticle) when the paraxial marginal ray enters the second group of lenses $G_2$, $h_2$ expresses the emergence height of the paraxial marginal ray from the axial object point (reticle center) when the paraxial marginal ray emerges from the second group of lenses $G_2$, $f_1$ expresses the focal length of the first group of lenses $G_1$, $f_2$ expresses the focal length of the second group of lenses $G_2$, $f_3$ expresses the focal length of the third group of lenses $G_3$, $H_{MAX}$ expresses the maximum height of the object from the optical axis of the projection optical system, $f_{21}$ expresses the focal length of the first group of sub lenses $G_{21}$, $f_{22}$ expresses the focal length of the second group of sub lenses $G_{22}$, $f_{23}$ expresses the focal length of the third group of sub lenses $G_{23}$, $u_1$ expresses the angle of incidence of the paraxial marginal ray when the paraxial marginal ray from the axial object point (reticle center) on the object (reticle) enters the first group of the lenses $G_1$, $u_2$ expresses the angle of incidence of the paraxial marginal ray when the paraxial marginal ray from the axial object point (reticle center) on the object (reticle) enters the second group of the lenses $G_2$, $u_2'$ expresses the angle of emergence of the paraxial marginal ray when the paraxial marginal ray from the axial object point (reticle center) on the object (reticle) emerges from the second group of the lenses $G_2$, $u_3'$ expresses an angle of emergence of the paraxial marginal ray when the paraxial marginal ray from the axial object point (reticle center) on the object (reticle) emerges from the third group of the lenses $G_3$.

[The First Embodiment]

| | R | D | n |
|---|---|---|---|
| 1. | −737.7847 | 27.484 | 1.5084 |
| 2. | −235.2891 | 0.916 | |
| 3. | 211.1786 | 36.646 | 1.5084 |
| 4. | −461.3986 | 0.916 | |
| 5. | 412.6778 | 21.071 | 1.5084 |
| 6. | 160.5391 | 16.197 | |
| 7. | −604.1283 | 7.215 | 1.5084 |
| 8. | 218.1877 | 23.941 | |
| 9. | −3586.0630 | 11.978 | 1.5084 |
| 10. | 251.8168 | 47.506 | |
| 11. | −85.2817 | 11.961 | 1.5084 |
| 12. | 584.8597 | 9.968 | |
| 13. | 4074.8010 | 35.291 | 1.5084 |
| 14. | −162.0185 | 0.923 | |
| 15. | 629.5440 | 41.227 | 1.5084 |
| 16. | −226.7397 | 0.916 | |
| 17. | 522.2739 | 27.842 | 1.5084 |
| 18. | −582.4240 | 0.916 | |
| 19. | 423.7290 | 22.904 | 1.5084 |
| 20. | −1385.360 | 0.916 | |
| 21. | 212.0390 | 33.646 | 1.5084 |
| 22. | 802.3695 | 55.304 | |
| 23. | −776.5697 | 8.703 | 1.5084 |
| 24. | 106.1728 | 24.090 | |
| 25. | −200.6830 | 11.452 | 1.5084 |
| 26. | 311.8264 | 59.540 | |
| 27. | −77.2276 | 11.772 | 1.5084 |
| 28. | 2317.8032 | 11.862 | |
| 29. | −290.8859 | 22.904 | 1.5084 |
| 30. | −148.3577 | 1.373 | |
| 31. | −5658.5043 | 41.227 | 1.5084 |
| 32. | −151.9858 | 0.916 | |
| 33. | 678.1005 | 32.981 | 1.5084 |
| 34. | −358.5540 | 0.916 | |
| 35. | 264.2734 | 32.814 | 1.5084 |
| 36. | 2309.6884 | 0.916 | |
| 37. | 171.2681 | 29.015 | 1.5084 |
| 38. | 364.7765 | 0.918 | |
| 39. | 113.3700 | 76.259 | 1.5804 |
| 40. | 78.6982 | 54.304 | |
| 41. | 49.5443 | 18.650 | 1.5084 |
| 42. | 109.8136 | | |

$d_0$ = 111.457, B = 1/4, NA = 0.57 $|F/(B\bullet L)|$ = 1.972,
$d_0/L$ = 0.115, $|h_1/h_1|$ 4.404, $f_1/L$ = 0.2123,
$H_{MAX}/L$ = 0.0492, $f_{22}/f_{21}$ = 1.861, $f_{23}/L$ = 0.0441,
$|u_2/u_1|$ = 0.3108, $|u_2/u_3'|$ = 0.1194, $|f_2|/f_1$ = 1.696,
$|f_2|/f_3$ = 2.054

[The Second Embodiment]

| | R | D | n |
|---|---|---|---|
| 1. | −1223.1398 | 24.282 | 1.5084 |
| 2. | −232.2056 | 0.722 | |
| 3. | 204.8444 | 30.564 | 1.5084 |
| 4. | −447.6254 | 0.847 | |
| 5. | 387.3032 | 22.577 | 1.5084 |
| 6. | 165.3136 | 17.125 | |
| 7. | −418.5788 | 7.676 | 1.5084 |
| 8. | 221.4873 | 27.686 | |
| 9. | −2045.8209 | 10.837 | 1.5084 |
| 10. | 251.8076 | 54.529 | |
| 11. | −86.1842 | 9.750 | 1.5084 |
| 12. | 571.1427 | 9.655 | |
| 13. | 4441.5091 | 35.219 | 1.5084 |
| 14. | −162.7515 | 0.722 | |
| 15. | 612.4291 | 45.153 | 1.5084 |
| 16. | −226.5527 | 0.722 | |
| 17. | 512.6140 | 27.995 | 1.5084 |
| 18. | −589.0357 | 0.722 | |
| 19. | 414.2030 | 23.028 | 1.5084 |
| 20. | −1429.9946 | 0.723 | |
| 21. | 206.1473 | 32.751 | 1.5084 |
| 22. | 798.3489 | 57.454 | |
| 23. | −768.6979 | 4.843 | 1.5084 |
| 24. | 104.0781 | 26.244 | |
| 25. | −197.9089 | 11.283 | 1.5084 |
| 26. | 299.1441 | 60.543 | |
| 27. | −76.3071 | 9.596 | 1.5084 |
| 28. | 2295.9831 | 12.283 | |
| 29. | −293.5256 | 22.155 | 1.5084 |
| 30. | −145.9082 | 0.722 | |
| 31. | −5409.7914 | 43.623 | 1.5084 |
| 32. | −150.7095 | 0.903 | |
| 33. | 672.7712 | 35.872 | 1.5084 |
| 34. | −356.3963 | 1.266 | |
| 35. | 260.6373 | 21.081 | 1.5084 |
| 36. | 2210.8442 | 0.904 | |
| 37. | 168.3759 | 32.593 | 1.5084 |
| 38. | 356.6590 | 0.906 | |
| 39. | 111.9024 | 73.751 | 1.5084 |
| 40. | 77.0212− | 55.394 | |
| 41. | 48.6611 | 18.581 | 1.5084 |
| 42. | 104.6612 | | |

$d_0 = 114.2133$, $B = 1/4$, $NA = 0.59$ $|F/(B{\bullet}L)| = 4.623$,
$d_0/L = 0.1142$, $|h_2/h_1| = 4.441$, $f_1/L = 0.1877$,
$H_{MAX}/L = 0.0488$, $f_{22}/f_{21} = 1.954$, $f_{23}/L = 0.0482$,
$|u_2/u_1| = 0.2743$, $|u_2'/u_3'| = 0.1241$, $|f_2|/f_1 = 1.726$,
$|f_2|/f_3 = 1.951$

[The Third Embodiment]

| | R | D | n |
|---|---|---|---|
| 1. | −1464.1814 | 27.311 | 1.5084 |
| 2. | −197.4800 | 0.910 | |
| 3. | 213.6498 | 36.414 | 1.5084 |
| 4. | −453.1668 | 0.910 | |
| 5. | 660.2421 | 20.938 | 1.5084 |
| 6. | 131.1947 | 24.104 | |
| 7. | −204.1448 | 14.633 | 1.5084 |
| 8. | 214.5858 | 66.100 | |
| 9. | −87.6301 | 11.885 | 1.5084 |
| 10. | 607.6141 | 9.660 | |
| 11. | 3779.9990 | 35.068 | 1.5084 |
| 12. | −160.1605 | 0.917 | |
| 13. | 641.3822 | 40.966 | 1.5084 |
| 14. | −226.3932 | 0.910 | |
| 15. | 519.9748 | 27.666 | 1.5084 |
| 16. | −576.3527 | 0.910 | |
| 17. | 421.2751 | 22.759 | 1.5084 |
| 18. | −1375.3272 | 0.910 | |
| 19. | 213.3258 | 33.433 | 1.5084 |
| 20. | 798.5812 | 52.334 | |
| 21. | −909.0523 | 8.648 | 1.5084 |

[The Third Embodiment]

| | R | D | n |
|---|---|---|---|
| 22. | 101.3672 | 25.461 | |
| 23. | −189.4319 | 11.379 | 1.5084 |
| 24. | 310.9463 | 67.090 | |
| 25. | −77.1182 | 11.698 | 1.5084 |
| 26. | 2551.2398 | 11.787 | |
| 27. | −292.0767 | 22.759 | 1.5084 |
| 28. | −148.2125 | 1.364 | |
| 29. | −5434.6970 | 40.966 | 1.5084 |
| 30. | −151.1391 | 0.910 | |
| 31. | 684.0637 | 32.773 | 1.5084 |
| 32. | −358.7967 | 0.910 | |
| 33. | 263.9918 | 32.603 | 1.5084 |
| 34. | 2197.6243 | 0.910 | |
| 35. | 170.2024 | 28.831 | 1.5084 |
| 36. | 361.3570 | 0.912 | |
| 37. | 112.5859 | 74.357 | 1.5084 |
| 38. | 78.3240 | 55.639 | |
| 39. | 49.7059 | 20.134 | 1.5084 |
| 40. | 110.2229 | | |

$d_0 = 109.638$, $B = 1/4$, $NA = 0.56$ $F/B{\bullet}L = 3.493$,
$d_0/L = 0.1096$, $|h_2/h_1| = 4.540$, $f_1/L = 0.1775$,
$H_{MAX}/L = 0.488$, $f_{22}/f_{21} = 1.974$, $f_{23}/L = 0.0421$,
$|u_2/u_1| = 0.2446$, $|u_2'/u_3'| = 0.1223$, $|f_2|/f_1 = 1.784$,
$|f_2|/f_3 = 1.899$ From the above values of various elements from each of the embodiments, it is understood that the telecentricity has been accomplished both on the object side (reticle side) and on the image side (wafer side) while maintaining a relatively large exposure area and the high numerical aperture NA of 0.55 or more, in spite of the configuration comprising relatively small number of the lenses and the fact that the entire length of the system and the lens diameters are constrained to be small.

Furthermore, in each of the above mentioned embodiments, examples are shown using the second group of lenses $G_2$ comprising 4 groups of sub lenses of negative, positive, negative, and positive, however, it is needless to say that the second group of lenses $G_2$ can be composed by 3 groups of sub lenses of negative, positive, negative.

Also the refractive power in the second group of lenses $G_2$ in each of the above mentioned embodiments has relatively weak positive refractive power, however, it is of course appropriate to compose the second group of lenses $G_2$ with zero refractive power, or relatively weak negative refractive power.

Furthermore, in each of the above mentioned embodiments, only a single glass material, namely, quartz ($SiO_2$) is used as an optical material to compose the projection optical system, however, if an exposure light has a certain half-value band width (FWHM), then it is possible to combine quartz ($SiO_2$) and quartzite ($C_aF_2$) to correct chromatic aberration, and furthermore, it is possible to correct chromatic aberration by combining other optical materials through which ultraviolet light can pass.

Also, each of the embodiments has shown examples using excimer laser which supplies a light of 248 nm as a light source, but it does not necessarily have to be limited to this, and it is needless to say that mercury-arc lamp which supplies g line (436 nm) and i line (365 nm) and excimer laser which supplies a light of 193 nm, and furthermore, other light sources which supply ultraviolet light can also be applied.

Also, it is also possible to use reflective members such as a reflecting mirror in place of a part of the lenses that compose the projection optical system.

What is claimed is:

1. A projection optical system that projects an image of an object in an object surface onto an image surface with a reduction magnification comprising, in light path order from said object surface:

a first group of lenses with positive refractive power;

a second group of lenses forming an approximately afocal system; and a third group of lenses with positive refractive power; wherein:

said projection optical system has a focal length F, said projection optical system has a projection magnification B, said object surface and said image surface are separated by a distance L, a lens surface in said first group of lenses that is closest to said object surface is separated from said object surface by a distance $d_0$, a paraxial marginal ray from an axial object point on said object surface enters said second group of lenses at an entrance height $h_1$ from an optical axis, the paraxial marginal ray from the axial object point on said object surface emerges from said second group of lenses at an emergence height $h_2$ from the optical axis, $1.8 \leq |F/(B \cdot L)| \leq 6$, $d_0/L \leq 0.2$, and $4 \leq |h_2/h_1| \leq 10$.

2. The projection optical system of claim 1, wherein:

said first group of lenses has a focal length $f_1$; and $0.05 \leq f_1/L \leq 0.3$.

3. The projection optical system of claim 2, wherein:

a maximum height of the object from the optical axis of said projection optical system on said object surface is represented by $H_{MAX}$; and $0.04 \leq H_{MAX}/L \leq 0.2$.

4. The projection optical system of claim 3, wherein:

said first group of lenses comprises at least two positive lenses;

said second group of lenses comprises at least four negative lenses and at least four positive lenses; and said third group of lenses comprises at least two positive lenses.

5. The projection optical system of claim 4, wherein said second group of lenses comprises, in light path order from said object surface:

a first subgroup of lenses with negative refractive power;

a second subgroup of lenses with positive refractive power; and a third subgroup of lenses with negative refractive power.

6. The projection optical system of claim 5, wherein:

said first subgroup of lenses has a focal length $f_{21}$;

said second subgroup of lenses has a focal length $f_{22}$; and $1.5 \leq |f_{22}/f_{21}| \leq 5$.

7. The projection optical system of claim 6, wherein:

said third subgroup of lenses has a focal length $f_{23}$; and $0.02 \leq |f_{23}/L| \leq 0.10$.

8. The projection optical system of claim 5, wherein:

said first subgroup of lenses has a focal length $f_{21}$;

said second subgroup of lenses has a focal length $f_{22}$; and $1.7 \leq |f_{22}/f_{21}| \leq 5$.

9. The projection optical system of claim 3, wherein:

said first group of lenses comprises at least two positive lenses;

said third group of lenses comprises at least two positive lenses;

said second group of lenses comprises, in light path order from said object surface, a first subgroup of lenses with negative refractive power, a second subgroup of lenses with positive refractive power, and a third subgroup of lenses with negative refractive power;

said first subgroup of lenses comprises at least two negative lenses;

said second subgroup of lenses comprises at least four positive lenses; and said third subgroup of lenses comprises at least two negative lenses.

10. The projection optical system of claim 9, wherein:

said second subgroup of lenses comprises two biconvex lenses.

11. The projection optical system of claim 8, wherein:

the paraxial marginal ray from the axial object point on said object surface enters said first group of lenses at an angle of incidence $u_1$;

the paraxial marginal ray from the axial object point on said object surface enters said second group of lenses at an angle of incidence $u_2$;

the paraxial marginal ray from the axial object point on said object surface emerges from said second group of lenses at an angle of emergence $u_2'$;

the paraxial marginal ray from the axial object point on said object surface emerges from said third group of lenses at an angle of emergence $u_3'$;

$|u_2/u_1| \leq 0.5$; and $|u_2'/u_3'| \leq 0.5$.

12. The projection optical system of claim 11, wherein:

said second group of lenses has a focal length $f_2$;

said third group of lenses has a focal length $f_3$;

$|f_2| > f_1$; and $|f_2| > f_3$.

13. The projection optical system of claim 3, wherein said second group of lenses comprises, in light path order from said object surface:

a first subgroup of lenses with negative refractive power;

a second subgroup of lenses with positive refractive power;

a third subgroup of lenses with negative refractive power; and a fourth subgroup of lenses with positive refractive power.

14. The projection optical system of claim 13, wherein:

said first group of lenses comprises at least two positive lenses, and said third group of lenses comprises at least two positive lenses;

said first subgroup of lenses comprises at least two negative lenses;

said second subgroup of lenses comprises at least four positive lenses;

said third subgroup of lenses comprises at least two negative lenses; and said fourth subgroup of lenses comprises at least two positive lenses.

15. The projection optical system of claim 14, wherein:

said first subgroup of lenses has a focal length $f_{21}$;

said second subgroup of lenses has a focal length $f_{22}$; and
$1.5 \leq |f_{22}/f_{21}| 5$.

16. The projection optical system of claim 15, wherein:
said third subgroup of lenses has a focal length $f_{23}$; and
$0.02 \leq |f_{23}/L| \leq 0.10$.

17. The projection optical system of claim 16, wherein:
$1.7 \leq |f_{22}/f_{21}| \leq 5$.

18. The projection optical system of claim 1, wherein said second group of lenses comprises, in light path order from said object surface:

a first subgroup of lenses with negative refractive power;

a second subgroup of lenses with positive refractive power; and a third subgroup of lenses with negative refractive power.

19. The projection optical system of claim 18, wherein said first subgroup of lenses comprises:

a negative lens with its stronger curvature facing the image surface side;

a negative biconcave negative lens; and a negative lens with its stronger curvature facing the object surface side.

20. The projection optical system of claim 19, wherein said second subgroup of lenses comprises:

a positive lens with its stronger curvature facing the object surface side;

at least two positive biconvex lenses; and a positive lens with its stronger curvature facing the image surface side.

21. The projection optical system of claim 20, wherein said third subgroup of lenses comprises:

a negative lens with its stronger curvature facing the image surface side;

a biconcave lens; and a negative lens with its stronger curvature facing the object surface side.

22. The projection optical system of claim 21, wherein:

said second group of lenses further comprises, on the image surface side of said third subgroup of lenses, a fourth subgroup of lenses with positive refractive power; and said fourth subgroup of lenses comprises at least two positive lenses with convex surfaces facing the image surface side.

23. The projection optical system of claim 22, wherein said first group of lenses comprises:

a positive lens with its stronger curvature facing the image surface side; and a positive biconvex lens.

24. The projection optical system of claim 23, wherein:

said third group of lenses comprises at least three positive lenses with convex surfaces facing the object surface side.

25. The projection optical system of claim 1, wherein said second group of lenses has weak positive refractive power.

26. A projection exposure apparatus comprising:

an illumination system that illuminates a first object having an object surface on which a pattern is formed;

a projection optical system which projects an image of said pattern onto an image surface on a second object;

a first supporting unit that supports said first object;

a second supporting unit that supports said second object; and said projection optical system comprising, in light path order from said object surface:

a first group of lenses with positive refractive power, said first group of lenses comprising at least two positive lenses;

a second group of lenses forming an approximately afocal system, said second group of lenses comprising, in light path order from said object surface, a first subgroup of lenses with negative refractive power, said first subgroup of lenses comprising at least two negative lenses a second subgroup of lenses with positive refractive power, said second subgroup of lenses comprising at least four positive lenses, and a third subgroup of lenses with negative refractive power, said third subgroup of lenses comprising at least two negative lenses; and a third group of lenses with positive refractive power, said third group of lenses comprising at least two positive lenses;

wherein:

said projection optical system has a focal length F, said projection optical system has a projection magnification B, said object surface and said image surface are separated by a distance L, a lens surface in said first group of lenses that is closest to said object surface is separated from said object surface by a distance $d_0$, a paraxial marginal ray from an axial object point on said object surface enters said second group of lenses at an entrance height $h_1$ from an optical axis, the paraxial marginal ray from the axial object point on said object surface emerges from said second group of lenses at an emergence height $h_2$ from the optical axis, $1.8 \leq |F/(B \cdot L)|$, $d_0/L \leq 0.2$, and $4 \leq |h_2/h_1| \leq 10$.

27. The projection exposure apparatus of claim 26, wherein said second group of lenses comprises, in light path order from said object surface:

a first subgroup of lenses with negative refractive power;

a second subgroup of lenses with positive refractive power; and a third subgroup of lenses with negative refractive power.

28. The projection exposure apparatus of claim 27, wherein said first subgroup of lenses comprises:

a negative lens with its stronger curvature facing the image surface side;

a negative biconcave lens; and a negative lens with its stronger curvature facing the object surface side.

29. The projection exposure apparatus of claim 27, wherein the second subgroup of lenses comprises:

a positive lens with its stronger curvature facing the object surface side;

at least two positive biconvex lenses; and a positive lens with its stronger curvature facing the image surface side.

30. The projection exposure apparatus of claim 27, wherein said third subgroup of lenses comprises:

a negative lens with its stronger curvature facing the image surface side;

a negative biconcave lens; and a negative lens with its stronger curvature facing the object surface side.

31. The projection exposure apparatus of claim 27, wherein:

said second group of lenses further comprises, on the image surface side of said third subgroup of lenses, a fourth subgroup of lenses with positive refractive power; and said fourth subgroup of lenses comprises at least two positive lenses with convex surfaces facing the image surface side.

32. A projection exposure apparatus comprising:

an illumination system that illuminates a first object having an object surface on which a pattern is formed;

a projection optical system which projects an image of said pattern onto an image surface on a second object;

a first supporting unit that supports said first object;

a second supporting unit that supports said second object; and said projection optical system comprising, in light path order from said object surface:

a first group with positive refractive power;

a second group forming an approximately afocal system; and a third group with positive refractive power;

wherein:

said projection optical system has a focal length F, said projection optical system has a projection magnification B, said object surface and said image surface are separated by a distance L, a lens surface in said first group of lenses that is closest to said object surface is separated from said object surface by a distance $d_0$, a paraxial marginal ray from an axial object point on said object surface enters said second group at an entrance height $h_1$ from an optical axis, the paraxial marginal ray from the axial object point on said object surface emerges from said second group at an emergence height $h_2$ from the optical axis, $1.8 \leq |F/(B \cdot L)| \leq 6$, $d_0/L \leq 0.2$, and $4 \leq |h_2/h_1| \leq 10$.

33. The projection exposure apparatus of claim 32, wherein said second group comprises, in light path order from said object surface:

a first subgroup with negative refractive power;

a second subgroup with positive refractive power; and a third subgroup with negative refractive power.

34. The projection exposure apparatus of claim 23, wherein:

said first group comprises at least two positive lenses;

said third group comprises at least two positive lenses;

said second group comprises, in light path order from said object surface, a first subgroup with negative refractive power, a second subgroup with positive refractive power, and a third subgroup with negative refractive power;

said first subgroup comprises at least two negative lenses;

said second subgroup comprises at least four positive lenses; and said third subgroup comprises at least two negative lenses.

35. The projection exposure apparatus of claim 34, wherein said second group further comprises, on the image surface side of said third subgroup, a fourth subgroup having positive refractive power.

36. The projection exposure apparatus of claim 35, wherein said fourth subgroup further comprises at least two positive lenses.

37. A method for manufacturing integrated circuits, comprising the steps of:

illuminating, with ultraviolet light, a mask having an object surface formed with a predetermined pattern:

projecting a reduced image of the pattern on the mask onto an image surface on a substrate through a projection optical system, thereby performing an exposure process;

wherein said projection optical system comprises, in light path order from said object surface:

a first group of lenses with positive refractive power, said first group of lenses comprising at least two positive lenses;

a second group of lenses forming an approximately afocal system; and a third group of lenses with positive refractive power, said third group of lenses comprising at least two positive lenses;

wherein said second group of lenses comprises, in light path order from said object surface:

a first subgroup of lenses with negative refractive power, said first subgroup of lenses comprising at least two negative lenses;

a second subgroup of lenses with positive refractive power, said second subgroup of lenses comprising at least four positive lenses; and a third subgroup of lenses with negative refractive power, said third subgroup of lenses comprising at least two negative lenses;

wherein:

said projection optical system has a focal length F, said projection optical system has a projection magnification B, said object surface and said image surface are separated by a distance L, a lens surface in said first group of lenses that is closest to said object surface is separated from said object surface by distance $d_0$, a paraxial marginal ray from an axial object point on said object surface enters said second group of lenses at an entrance height $h_1$, from an optical axis, the paraxial marginal ray from the axial object point on said object surface emerges from said second group of lenses at an emergence height $h_2$ from the optical axis, $1.8 \leq |F/(B \cdot L)| \leq 6$, $d_0/L \leq 0.2$, and $4 \leq |h_2/h_1| \leq 10$.

38. The method of claim 37, wherein said second subgroup of lenses further comprises, on the image surface side of said third subgroup of lenses, a fourth subgroup having positive refractive power.

39. The method of claim 38, wherein said fourth subgroup comprises at least two positive lenses.

40. The method of claim 39, wherein:

said first group of lenses has a focal length $f_1$; and $0.05 \leq f_1/L \leq 0.3$.

41. The method of claim 40, wherein:

a maximum height of an object from the optical axis of said projection optical system on said object surface is represented by $H_{MAX}$; and $0.04 \leq H_{MAX}/L \leq 0.2$.

42. The method of claim 41, wherein:

said first subgroup of lenses has a focal length $f_{21}$;

said second subgroup of lenses has a focal length $f_{22}$; and $1.5 \leq |f_{22}/f_{21}| \leq 5$.

43. The method of claim 42, wherein:

said third subgroup of lenses has a focal length $f_{23}$; and $0.02 \leq |f_{23}/L| \leq 0.10$.

44. The method of, claim 41, wherein:

said first subgroup of lenses has a focal length $f_{21}$;

said second subgroup of lenses has a focal length $f_{22}$; and $1.7 \leq |f_{22}/f_{21}| \leq 5$.

45. A projection exposure method, comprising the step of:

illuminating, with ultraviolet light, a mask having an object surface formed a predetermined pattern;

projecting a reduced image of the pattern on the mask onto an image surface on a substrate through a projection optical system, thereby performing an exposure process:

wherein said projection optical system comprises, in light path order from said object surface:

a first group of lenses with positive refractive power, said first group of lenses comprising at least two positive lenses;

a second group of lenses forming an approximately afocal system; and a third group of lenses with positive refractive power, said third group of lenses comprising at least two positive lenses;

wherein said second group of lenses comprises, in light path order from said object surface:

a first subgroup of lenses with negative refractive power, said first subgroup of lenses comprising at least two negative lenses;

a second subgroup of lenses with positive refractive power, said second subgroup of lenses comprising at least four positive lenses; and a third subgroup of lenses with negative refractive power, said third subgroup of lenses at least two negative lenses;

wherein:

said projection optical system has a focal length F, said projection optical system has a projection magnification B, said object surface and said image surface are separated by a distance L, a lens surface in said first group of lenses that is closest to said object surface is separated from said object surface by a distance $d_0$, a paraxial marginal ray from an axial object point on said object surface enters said second group of lenses at an entrance height $h_1$ from an optical axis, the paraxial marginal ray from the axial object point on said object surface emerges from said second group of lenses at an emergence height $h_2$ from the optical axis, $1.8 \leq |F/(B \cdot L)|$, $d_0/L \leq 0.2$, and $4 \leq |h_2/h_1| \leq 10$.

46. The projection exposure method of claim 45, wherein said second subgroup of lenses further comprises, on the image surface side of said third subgroup of lenses, a fourth subgroup having positive refractive power.

47. The projection exposure method of claim 46, wherein said fourth subgroup comprises at least two positive lenses.

48. The projection exposure method of claim 47, wherein:

said first group of lenses has a focal length $f_1$; and $0.05 \leq f_1/L \leq 0.3$.

49. The projection exposure method of claim 48, wherein:

a maximum height of an object from the optical axis of said projection optical system on said object surface is represented by $H_{MAX}$; and $0.04 \leq H_{MAX}/L \leq 0.02$.

50. The projection exposure method of claim 49, wherein:

said first subgroup of lenses has a focal length $f_{21}$;

said second subgroup of lenses has a focal length $f_{22}$; and $1.5 \leq |f_{22}/f_{21}| \leq 5$.

51. The projection exposure method of claim 50, wherein:

said third subgroup of lenses has a focal length $f_{23}$; and $0.02 \leq |f_{23}/L| \leq 0.10$.

52. The projection exposure method of claim 49, wherein:

said first subgroup of lenses has a focal length $f_{21}$;

said second subgroup of lenses has a focal length $f_{22}$; and $1.7 \leq |f_{22}/f_{21}| \leq 5$.

53. A projection optical system that projects an image of an object in an object surface onto an image surface with a reduction magnification comprising, in light path order from said object surface:

a first group of lenses with positive refractive power;

a second group of lenses forming an approximately afocal system; and a third group of lenses with positive refractive power;

wherein:

said projection optical system has a focal length F, said projection optical system has a projection magnification B, said object surface and said image surface are separated by a distance L, a lens surface in said first group of lenses that is closest to said object surface is separated from said object surface by a distance $d_0$;

a paraxial marginal ray from an axial object point on said object surface enters said second group of lenses at an entrance height $h_1$ from an optical axis, the paraxial marginal ray from the axial object point on said object surface emerges from said second group of lenses at an emergence height $h_2$ from the optical axis, $1.8 \leq |F/(B \cdot L)|$, $d_0/L \leq 0.2$, and $4 \leq |h_2/h_1| \leq 10$.

54. An exposure method for exposing a predetermined pattern formed on a mask onto a substrate by using the projection optical system according to claim 53 the method comprising the steps of:

illuminating the mask in said object surface with light of a predetermined exposure wavelength; and projecting an image of said pattern formed on said mask onto said substrate in said image surface through said projection optical system.

55. The exposure method of claim 54 wherein said predetermined pattern formed on said mask is an integrated circuit pattern.

* * * * *

UNITED STATES PATENT AND TRADEMARK OFFICE
CERTIFICATE OF CORRECTION

PATENT NO. : 5,831,776
DATED : November 3, 1998
INVENTOR(S) : Toshihiro Sasaya, et. al.

It is certified that error appears in the above-indentified patent and that said Letters Patent is hereby corrected as shown below:

In col. 2, line 42, please change "he" to --the--.

In col. 18, in [The First Embodiment] between lines 60 and 65, please change "$|h_1/h_1|$" to --$|h_2/h_1|$--.

In col. 19, in [The Second Embodiment] between lines 40 and 45, please change "0.0482" to --0.0428--.

In col. 27, line 41, insert --comprising-- after "subgroup of lenses".

Signed and Sealed this

Thirtieth Day of November, 1999

Attest:

Q. TODD DICKINSON

Attesting Officer

Acting Commissioner of Patents and Trademarks